(12) United States Patent  
Shiono et al.

(10) Patent No.: US 10,351,718 B2  
(45) Date of Patent: Jul. 16, 2019

(54) OPTICAL FILTER AND IMAGING DEVICE

(71) Applicant: AGC Inc., Chiyoda-ku (JP)

(72) Inventors: Kazuhiko Shiono, Koriyama (JP); Keigo Matsuura, Koriyama (JP); Hiroki Hotaka, Koriyama (JP)

(73) Assignee: AGC Inc., Chiyoda-ku (JP)

( * ) Notice: Subject to any disclaimer, the term of this patent is extended or adjusted under 35 U.S.C. 154(b) by 97 days.

(21) Appl. No.: 15/355,190

(22) Filed: Nov. 18, 2016

(65) Prior Publication Data

US 2017/0066933 A1 Mar. 9, 2017

Related U.S. Application Data

(63) Continuation of application No. PCT/JP2016/054485, filed on Feb. 16, 2016.

(30) Foreign Application Priority Data

Feb. 18, 2015 (JP) .................. 2015-030077

(51) Int. Cl.
  *C09D 5/32* (2006.01)
  *G02B 1/115* (2015.01)
  (Continued)

(52) U.S. Cl.
  CPC .............. *C09D 5/32* (2013.01); *C09B 23/105* (2013.01); *C09B 57/007* (2013.01); (Continued)

(58) Field of Classification Search
  CPC ........ G02B 5/281; G02B 5/208; G02B 1/113; G02B 1/115; G02B 5/223; H04N 5/335; (Continued)

(56) References Cited

U.S. PATENT DOCUMENTS 8,159,596 B2  4/2012  Yamano  
9,090,776 B2  7/2015  Steppel et al.  
(Continued)

FOREIGN PATENT DOCUMENTS

CN  103858028  6/2014  
JP  1-228960  9/1989  
(Continued)

OTHER PUBLICATIONS

International Search Report issued May 17, 2016 in PCT/JP2016/054485, filed on Feb. 16, 2016 ( with English Translation).

(Continued)

*Primary Examiner* — Ermias T Woldegeorgis  
(74) *Attorney, Agent, or Firm* — Oblon, McClelland, Maier & Neustadt, L.L.P.

(57) ABSTRACT

An optical filter includes an absorption layer containing a near-infrared absorbing dye with an absorption characteristic in dichloromethane satisfying (i-1) to (i-3). (i-1) In an absorption spectrum of a wavelength of 400 to 800 nm, there is a maximum absorption wavelength $\lambda_{max}$ in 670 to 730 nm. (i-2) Between a maximum absorption coefficient $\varepsilon_A$ of light with a wavelength of 430 to 550 nm and a maximum absorption coefficient $\varepsilon_B$ of light with a wavelength of 670 to 730 nm, the following relational expression: $\varepsilon_B/\varepsilon_A \geq 65$ is established. (i-3) In a spectral transmittance curve, the difference between a wavelength $\lambda_{80}$ with which the transmittance becomes 80% on a shorter wavelength side than the maximum absorption wavelength with the transmittance at the maximum absorption wavelength $\lambda_{max}$ set to 10% and the maximum absorption wavelength $\lambda_{max}$ is 65 nm or less.

20 Claims, 3 Drawing Sheets

(51) Int. Cl.

| | | |
|---|---|---|
| H04N 5/335 | (2011.01) | |
| G02B 1/113 | (2015.01) | |
| G02B 5/28 | (2006.01) | |
| C09D 201/00 | (2006.01) | |
| C09B 57/00 | (2006.01) | |
| C09D 145/00 | (2006.01) | |
| C09D 167/00 | (2006.01) | |
| C09D 169/00 | (2006.01) | |
| G02B 5/20 | (2006.01) | |
| G02B 5/22 | (2006.01) | |
| H01L 27/146 | (2006.01) | |
| C09D 7/41 | (2018.01) | |
| C09B 23/10 | (2006.01) | |
| C09B 67/22 | (2006.01) | |
| C08K 5/00 | (2006.01) | |
| C08K 5/3415 | (2006.01) | |
| C08K 5/3417 | (2006.01) | |

(52) U.S. Cl.
CPC ............ *C09B 67/0034* (2013.01); *C09D 7/41* (2018.01); *C09D 145/00* (2013.01); *C09D 167/00* (2013.01); *C09D 169/00* (2013.01); *C09D 201/00* (2013.01); *G02B 1/113* (2013.01); *G02B 1/115* (2013.01); *G02B 5/208* (2013.01); *G02B 5/223* (2013.01); *G02B 5/281* (2013.01); *H01L 27/14621* (2013.01); *H01L 27/14627* (2013.01); *H01L 27/14645* (2013.01); *H04N 5/335* (2013.01); *C08K 5/0041* (2013.01); *C08K 5/3415* (2013.01); *C08K 5/3417* (2013.01)

(58) Field of Classification Search
CPC ......... H01L 27/14621; H01L 27/14627; H01L 27/14645
See application file for complete search history.

(56) References Cited

U.S. PATENT DOCUMENTS

| | | | | |
|---|---|---|---|---|
| 2009/0002620 | A1* | 1/2009 | Yamashita | C08F 297/026 349/137 |
| 2009/0052017 | A1* | 2/2009 | Sasaki | B32B 27/18 359/350 |
| 2012/0197026 | A1 | 8/2012 | Maeda et al. | |
| 2014/0055652 | A1* | 2/2014 | Hasegawa | G02B 5/281 348/294 |
| 2014/0061505 | A1 | 3/2014 | Steppel et al. | |
| 2014/0063597 | A1 | 3/2014 | Shimmo et al. | |
| 2014/0091419 | A1 | 4/2014 | Hasegawa et al. | |
| 2014/0264202 | A1 | 9/2014 | Nagaya et al. | |
| 2015/0146057 | A1 | 5/2015 | Konishi et al. | |

FOREIGN PATENT DOCUMENTS

| | | |
|---|---|---|
| JP | 1-228961 | 9/1989 |
| JP | 2006-106570 | 4/2006 |
| JP | 2006-301489 | 11/2006 |
| JP | 2008-51985 | 3/2008 |
| JP | 2008-181028 | 8/2008 |
| JP | 2011-100084 | 5/2011 |
| JP | 2012-103340 | 5/2012 |
| JP | 2012-137645 | 7/2012 |
| JP | 2012-137646 | 7/2012 |
| JP | 2012-137647 | 7/2012 |
| JP | 2012-137648 | 7/2012 |
| JP | 2012-137649 | 7/2012 |
| JP | 2012-137650 | 7/2012 |
| JP | 2012-137651 | 7/2012 |
| JP | 2013-190553 | 9/2013 |
| JP | 2014-59550 | 4/2014 |
| JP | 2014-126642 | 7/2014 |
| JP | 2014-148567 | 8/2014 |
| KR | 10-2014-0088559 | 7/2014 |
| TW | 201321438 | 6/2013 |
| WO | WO 2011/086785 A1 | 7/2011 |
| WO | WO 2013/054864 A1 | 4/2013 |
| WO | WO 2014/002864 A1 | 1/2014 |
| WO | WO 2014/088063 A1 | 6/2014 |
| WO | WO 2014/163405 A1 | 10/2014 |
| WO | WO 2014/168189 A1 | 10/2014 |
| WO | WO 2014/192714 A1 | 12/2014 |
| WO | WO 2014/192715 A1 | 12/2014 |
| WO | WO 2015/022892 A1 | 2/2015 |
| WO | WO 2015/034211 A1 | 3/2015 |
| WO | WO 2015/034217 A1 | 3/2015 |
| WO | WO 2015/099060 A1 | 7/2015 |
| WO | WO 2015/122595 A1 | 8/2015 |
| WO | WO 2016/043166 A1 | 3/2016 |

OTHER PUBLICATIONS

Written Opinion dated May 17, 2016 in PCT/JP2016/054485, filed on Feb. 16, 2016.

* cited by examiner ns of different dyes, and absorption increases collaterally, resulting in that there is also a problem of failing to obtain a high visible light transmittance.

OPTICAL FILTER AND IMAGING DEVICE

CROSS-REFERENCE TO RELATED APPLICATIONS

This application is a continuation of prior International Application No. PCT/JP2016/054485, filed on Feb. 16, 2016 which is based upon and claims the benefit of priority from Japanese Patent Application No. 2015-030077, filed on Feb. 18, 2015; the entire contents of all of which are incorporated herein by reference.

FIELD

The present invention relates to an optical filter that transmits visible light and cuts off near-infrared light and an imaging device provided with the optical filter.

BACKGROUND

In an imaging device using a solid-state image sensing device such as a CCD or a COMS image sensing device, which is mounted on a digital still camera and the like, an optical filter (near-infrared cut filter) that transmits visible light and blocks near-infrared light has been used for the purpose of well reproducing a color tone and obtaining a clear image. In such an optical filter, particularly a dye having high absorbency in a near-infrared region and having a high transmitting property in a visible region is used, thereby making it possible to obtain a steep cutoff property with respect to the near-infrared light and obtain good color reproducibility of an image by visible light.

In the meantime, even though the both properties of the high cutoff property of near-infrared light and the high transmitting property of visible light are tried to be obtained, it is difficult to obtain a 100% transmittance with respect to the light in the entire visible region, and a region relatively low in transmittance exists in the visible region. For example, an already-known squarylium-based dye is excellent in cutoff property of near-infrared light, has a high level of visible light transmittance, and has a characteristic in which the transmittance toward the near-infrared region from the visible region changes steeply. The present applicant has found out before that an optical filter containing the squarylium-based dye enables achievement of a visible light transmittance of a certain level or more (Patent Reference 1 (International Publication WO2014/088063)). However, a demand for higher precision color reproducibility is increasing by further increasing the visible light transmittance. Particularly, there is strongly growing a demand for increasing the precision of color reproducibility of a blue colored image by more increasing the transmittance of light with a wavelength of 430 to 550 nm being a relatively short wavelength in the visible region.

Thus, for the purpose of increasing the visible light transmittance, various squarylium dyes having a new structure also have been proposed, but have not reached a satisfactory level yet (Patent Reference 2 (JP-A 2014-148567) and Patent Reference 3 ((International Publication WO2011/086785)).

Further, there has been proposed an optical filter using a squarylium-based dye and a phthalocyanine-based dye in combination (Patent Reference 4 (International Publication WO2013/054864)), but as the transmitting property of visible light, the technique of increasing a transmittance with respect to light with a wavelength of 430 to 550 nm in particular has not been disclosed therein. Further, Patent Reference 4 uses a plurality of kinds of different dyes, and therefore visible light absorption increases collaterally, resulting in that there is also a problem of failing to obtain a high visible light transmittance.

SUMMARY

The present invention has a object to provide an optical filter that is capable of achieving an excellent light blocking property with respect to near-infrared light and has a high visible light transmitting property, in particular which is an increased transmittance of light with a wavelength of 430 to 550 nm, and an imaging device excellent in color reproducibility using the optical filter.

An optical filter according to one aspect of the present invention includes an absorption layer containing a near-infrared absorbing dye with an absorption characteristic measured by dissolved in dichloromethane satisfying (i-1) to (i-3), (i-1) in an absorption spectrum of a wavelength of 400 to 800 nm, there is a maximum absorption wavelength $\lambda_{max}$ in 670 to 730 nm, (i-2) between a maximum absorption coefficient $\varepsilon_A$ of light with a wavelength of 430 to 550 nm and a maximum absorption coefficient $\varepsilon_B$ of light with a wavelength of 670 to 730 nm, the following relational expression is established, and $\varepsilon_B/\varepsilon_A \geq 65$ (i-3) in a spectral transmittance curve, the difference between a wavelength $\lambda_{80}$ with which the transmittance becomes 80% on a shorter wavelength side than the maximum absorption wavelength with the transmittance at the maximum absorption wavelength $\lambda_{max}$ set to 10% and the maximum absorption wavelength $\lambda_{max}$ is 65 nm or less.

Further, an imaging device according to the present invention includes a solid-state image sensing device, an imaging lens, and the above-described optical filter.

According to the present invention, it is possible to obtain an optical filter that is excellent in cutoff property with respect to near-infrared light and has a high transmittance in a visible region, particularly, of light with a wavelength of 430 to 550 nm. Further, an imaging device excellent in color reproducibility can be obtained by mounting the optical filter thereon.

DETAILED DESCRIPTION

Hereinafter, there will be explained an embodiment of the present invention, and an optical filter is also abbreviated as "NIR filter," a near-infrared absorbing dye is also abbreviated as "NIR dye," and an ultraviolet absorbing dye is also abbreviated as "UV dye."

<NIR Filter>

The NIR filter of one embodiment of the present invention (hereinafter referred to as "present filter") includes one layer or two or more layers of an absorption layer. When the absorption layer has two or more layers, each layer may be of the same structure or different structure. In this case, one layer may be a near-infrared absorbing layer constituted of a resin with a NIR dye as that which will be described later, and the other layer may be an ultraviolet absorbing layer constituted of a resin with an UV dye. Further, the absorption layer itself may be one functioning as a substrate (resin substrate).

The present filter may further include one layer of a selected wavelength blocking layer that blocks light in a specific wavelength region, and may also include two or more layers of the selected wavelength blocking layer. When the filter has two or more layers of the selected wavelength blocking layer, each layer may be of the same structure or different structure, and for example, one layer may be a near-infrared blocking layer that blocks at least near-infrared light and the other layer may be an ultraviolet blocking layer that blocks at least ultraviolet light.

Further, the present filter may include a transparent substrate. In this case, the above-described absorption layer and selected wavelength blocking layer may be provided on the same main surface of the transparent substrate, or may be provided on different main surfaces. When the absorption layer and the selected wavelength blocking layer are provided on the same main surface, the order of stacking them is not particularly limited. Further, the present filter may include another functional layer such as an anti-reflection layer.

Figure 1A:
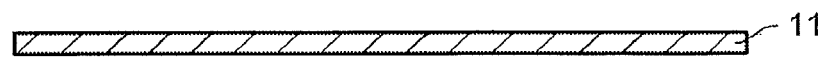
FIG. 1A is a cross-sectional view schematically illustrating an example of an optical filter of one embodiment.
Figure 1B:
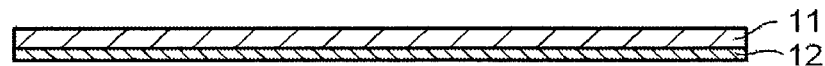
FIG. 1B is a cross-sectional view schematically illustrating an example of an optical filter of one embodiment.
Figure 1C:
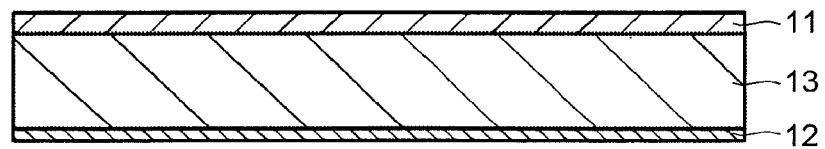
FIG. 1C is a cross-sectional view schematically illustrating an example of an optical filter of one embodiment.

A structural example of the present filter will be explained below. FIG. 1A illustrates a structural example having an absorption layer 11, and FIG. 1B illustrates a structural example having a selected wavelength blocking layer 12 on one main surface of the absorption layer 11. Note that "having another layer such as the selected wavelength blocking layer 12 on one main surface of the absorption layer 11" is not limited to the case where another layer is provided in contact with the absorption layer 11, and includes the case where a different functional layer is provided between the absorption layer 11 and another layer, and the same applies to structures below. FIG. 1C illustrates a structural example having the absorption layer 11 on one main surface of a transparent substrate 13.

In FIGS. 1A to 1C, the absorption layer 11 may include two layers of a near-infrared absorbing layer and an ultraviolet absorbing layer. For example, in FIG. 1B, the structure may have a near-infrared absorbing layer on the selected wavelength blocking layer 12 and an ultraviolet absorbing layer on the near-infrared absorbing layer, or the structure may include these two layers stacked in the reverse order. Similarly, in FIG. 1C, the structure may have a near-infrared absorbing layer on the transparent substrate 13 and an ultraviolet absorbing layer on the near-infrared absorbing layer, or the structure may include these two layers stacked in the reverse order.

Figure 1D:
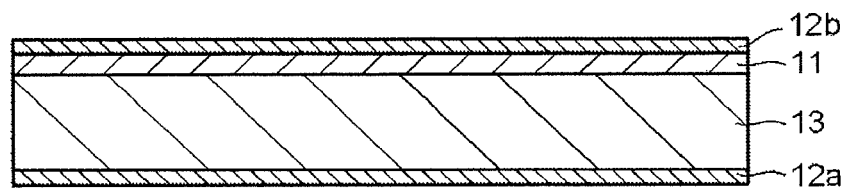
FIG. 1D is a cross-sectional view schematically illustrating an example of an optical filter of one embodiment.
Figure 1E:
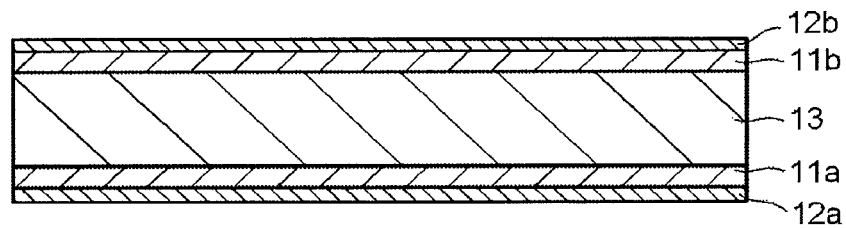
FIG. 1E is a cross-sectional view schematically illustrating an example of an optical filter of one embodiment.

FIG. 1D illustrates an example having the absorption layer 11 on one main surface of the transparent substrate 13, and having selected wavelength blocking layers 12a and 12b on the other main surface of the transparent substrate 13 and a main surface of the absorption layer 11. FIG. 1E illustrates an example having absorption layers 11a and 11b on both main surfaces of the transparent substrate 13, and further having the selected wavelength blocking layers 12a and 12b on main surfaces of the absorption layers 11a and 11b.

The selected wavelength blocking layers 12a and 12b reflect ultraviolet light and near-infrared light and have a visible light transmitting property, and for example, the structure is such that the selected wavelength blocking layer 12a reflects ultraviolet light and first near-infrared light and the selected wavelength blocking layer 12b reflects ultraviolet light and second near-infrared light.

Figure 1F:
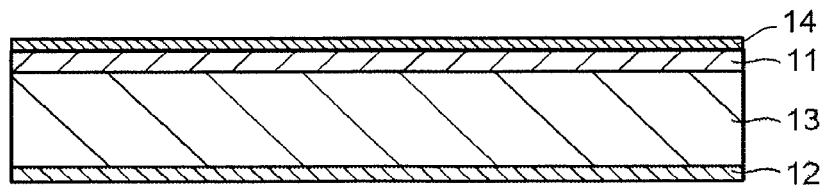
FIG. 1F is a cross-sectional view schematically illustrating an example of an optical filter of one embodiment.

FIG. 1F illustrates an example having an anti-reflection layer 14 on the main surface of the absorption layer 11 of the filter illustrated in FIG. 1C. In the case where a structure in which the absorption layer is the uppermost surface is taken, the anti-reflection layer may be provided on the absorption layer, and the anti-reflection layer may cover not only the uppermost surface of the absorption layer but also the entire side surfaces of the absorption layer. In this case, the damp-proof effect of the absorption layer can be enhanced. Hereinafter, the selected wavelength blocking layer will be explained as a "reflection layer" having a reflection function unless otherwise noted.

The present filter only need to satisfy (iv-1), preferably satisfy at least one of (iv-2) to (iv-6), and more preferably satisfy (iv-1) to (iv-6) all.

(iv-1) to (iv-4) are requirements in a spectral transmittance curve at an incident angle of 0°.

(iv-1) An average transmittance of light with a wavelength of 430 to 550 nm is 90% or more and the minimum transmittance of light with a wavelength of 430 to 550 nm is 75% or more.

(iv-2) An average transmittance of light with a wavelength of 600 to 700 nm is 25% or more.

(iv-3) An average transmittance of light with a wavelength of 350 to 395 nm is 2% or less.

(iv-4) An average transmittance of light with a wavelength of 710 to 1100 nm is 2% or less.

(iv-5) An average value of an absolute value of a difference between a transmittance of light with a wavelength of 385 to 430 nm in a spectral transmittance curve at an incident angle of 0° and a transmittance of light with a wavelength of 385 to 430 nm in a spectral transmittance curve at an incident angle of 30° (hereinafter referred to as "transmittance average shift amount of a wavelength of 385 to 430 nm") is 7%/nm or less.

(iv-6) An average value of an absolute value of a difference between a transmittance of light with a wavelength of 600 to 700 nm in a spectral transmittance curve at an incident angle of 0° and a transmittance of light with a wavelength of 600 to 700 nm in a spectral transmittance curve at an incident angle of 30° (hereinafter referred to as "transmittance average shift amount of a wavelength of 600 to 700 nm") is 7%/nm or less.

Satisfying (iv-1) makes it possible to increase the transmittance of the light with a wavelength of 430 to 550 nm, and further increase the precision of color reproducibility of a blue colored image.

Satisfying (iv-2) makes it possible to efficiently transmit the light with a wavelength of 600 to 700 nm, which is involved in the visibility of a human being, while cutting the light with a wavelength more than 700 nm, which is unnecessary for a solid-state image sensing device.

Satisfying (iv-3) makes it possible to block the light with a wavelength of 350 to 395 nm and make spectral sensitivity of a solid-state image sensing device approximate to visibility of a human being.

Satisfying (iv-4) makes it possible to block the light with a wavelength of 710 to 1100 nm and make spectral sensitivity of a solid-state image sensing device approximate to visibility of a human being.

Satisfying (iv-5) makes it possible to decrease incident angle dependence of the light with a wavelength of 385 to 430 nm and decrease incident angle dependence of spectral sensitivity of a solid-state image sensing device in this wavelength region.

Satisfying (iv-6) makes it possible to decrease incident angle dependence of the light with a wavelength of 600 to 700 nm and decrease incident angle dependence of spectral sensitivity of a solid-state image sensing device in this wavelength region.

In the present filter, the average transmittance of the light with a wavelength of 430 to 550 nm is preferred to be 91% or more and more preferred to be 92% or more in (iv-1). Further, in (iv-1), the minimum transmittance of the light with a wavelength of 430 to 550 nm is preferred to be 77% or more and more preferred to be 80% or more. Further, in the present filter, the average transmittance of the light with a wavelength of 600 to 700 nm is preferred to be 30% or more in (iv-2).

Further, in the present filter, in the spectral transmittance curve at an incident angle of 0°, an average transmittance of the light with a wavelength of 430 to 480 nm is preferred to be 87% or more, more preferred to be 88% or more, still more preferred to be 89% or more, and further preferred to be 90% or more. As the average transmittance is higher in particular, the precision of color reproducibility of a blue colored image can be increased.

In the present filter, in (iv-3), the average transmittance of the light with a wavelength of 350 to 395 nm is preferred to be 1.5% or less, more preferred to be 1% or less, and further preferred to be 0.5% or less. Further, in (iv-4), the average transmittance of the light with a wavelength of 710 to 1100 nm is preferred to be 1% or less, more preferred to be 0.5% or less, and further preferred to be 0.3% or less. Further, in (iv-5), the transmittance average shift amount of the wavelength of 385 to 430 nm is preferred to be 6%/nm or less and more preferred to be 5%/nm or less. Further, in (iv-6), the transmittance average shift amount of the wavelength of 600 to 700 nm is preferred to be 3%/nm or less and more preferred to be 2%/nm or less.

Next, the transparent substrate, the absorption layer, the reflection layer, and the anti-reflection layer of the present filter will be explained.

[Transparent Substrate]

In the case of using the transparent substrate, the thickness of the transparent substrate is preferred to be 0.03 to 5 mm, and from the point of thickness reduction, more preferred to be 0.05 to 1 mm, and as long as the transparent substrate is one that transmits visible light, an inorganic material such as glass, lithium niobate, sapphire, or crystal, or an organic material such as resin can be used.

Examples of resins that can be used for the transparent substrate include polyester resins such as polyethylene terephthalate and polybutylene terephthalate; polyolefin resins such as polyethylene, polypropylene, and an ethylene-vinyl acetate copolymer; norbornene resins; acrylic resins such as polyacrylate and polymethylmethacrylate; urethane resins; vinyl chloride resins; fluorocarbon resins; polycarbonate resins; polyvinyl butyral resins; polyvinyl alcohol resins; and the like.

Examples of glasses that can be used for the transparent substrate include an absorption-type glass (near-infrared absorbing glass) made by adding CuO or the like to a fluorophosphate-based glass, a phosphate-based glass, or the like, a soda lime glass, a borosilicate glass, a non-alkali glass, a quartz glass, and the like. Note that "phosphate-based glass" includes a silicophosphate glass in which part of the skeleton of the glass is constituted of $SiO_2$. Here, specific composition examples of a glass containing CuO used for the transparent substrate will be described.

(1) A glass containing 0.5 to 7 parts by mass of CuO in outer ratio relative to 100 parts by mass of a base glass containing, in mass %, $P_2O_5$ 46 to 70%, $AlF_3$ 0.2 to 20%, $LiF+NaF+KF$ 0 to 25%, and $MgF_2+CaF_2+SrF_2+BaF_2+PbF_2$ 1 to 50%, where F is 0.5 to 32% and O is 26 to 54%.

(2) A glass constituted of in mass %, $P_2O_5$ 25 to 60%, $Al_2OF_3$ 1 to 13%, MgO 1 to 10%, CaO 1 to 16%, BaO 1 to 26%, SrO 0 to 16%, ZnO 0 to 16%, $Li_2O$ 0 to 13%, $Na_2O$ 0 to 10%, $K_2O$ 0 to 11%, CuO 1 to 7%, ΣRO (R=Mg, Ca, Sr, Ba) 15 to 40%, and $ΣR'_2O$ (R'=Li, Na, K) 3 to 18% (where $O^{2-}$ ions up to 39 mol % amount are substituted with $F^-$ ions).

(3) A glass containing, in mass %, $P_2O_5$ 5 to 45%, $AlF_3$ 1 to 35%, RF (where R is Li, Na, K) 0 to 40%, $R'F_2$ (where R' is Mg, Ca, Sr, Ba, Pb, or Zn) 10 to 75%, $R''F_m$ (where R" is La, Y, Cd, Si, B, Zr, or Ta, and m is a number equivalent to the atomic value of R") 0 to 15% (where up to 70% of the total volume of fluoride can be substituted with an oxide), and CuO 0.2 to 15%.

(4) A glass containing, in cation %, $P^{5+}$ 11 to 43%, $Al^{3+}$ 1 to 29%, R cations (total amount of Mg, Ca, Sr, Ba, Pb, and Zn ions) 14 to 50%, R' cations (total amount of Li, Na, and K ions) 0 to 43%, R" cations (total amount of La, Y, Gd, Si, B, Zr, and Ta ions) 0 to 8%, and $Cu^{2+}$ 0.5 to 13%, and further containing $F^-$ 17 to 80% in anion %.

(5) A glass containing, in cation %, $P^{5+}$ 23 to 41%, $Al^{3+}$ 4 to 16%, $Li^+$ 11 to 40%, $Na^+$ 3 to 13%, $R^{2+}$ (total amount of $Mg^{2+}$, $Ca^{2+}$, $Sr^{2+}$, $Ba^{2+}$, and $Zn^{2+}$) 12 to 53%, and $Cu^{2+}$ 2.6 to 4.7%, and further containing, in anion %, $F^-$ 25 to 48% and $O^{2-}$ 52 to 75%.

(6) A glass containing 0.1 to 5 parts by mass of CuO in outer ratio relative to 100 parts by mass of a base glass constituted of; in mass %, $P_2O_5$ 70 to 85%, $Al_2O_3$ 8 to 17%, $B_2O_3$ 1 to 10%, $Li_2O$ 0 to 3%, $Na_2O$ 0 to 5%, and $K_2O$ 0 to 5%, where $Li_2O+Na_2O+K_2O$ is 0.1 to 5%, and $SiO_2$ 0 to 3%.

Exemplifying commercial products, for example, there are cited NF-50E, NF-50EX, NF-50T, NF-50TX (product name, made by Asahi Glass Co., Ltd.), or the like for the glass of (1), BG-60, BG-61 (product name, made by Schott AG), or the like for the glass of (2), and CD 5000 (product name, made by HOYA Corporation), or the like for the glass of (5).

The above-described CuO-containing glasses may further contain a metal oxide. For example, when one kind or two or more kinds of $Fe_2O_3$, $MoO_3$, $WO_3$, $CeO_2$, $Sb_2O_3$, $V_2O_5$, and the like are contained as the metal oxide, the CuO-containing glasses have an ultraviolet absorption characteristic. The content of these metal oxides is preferably such that at least one kind selected from the group consisting of $Fe_2O_3$, $MoO_3$, $WO_3$, and $CeO_2$ is contained by $Fe_2O_3$ 0.6 to 5 parts by mass, $MoO_3$ 0.5 to 5 parts by mass, $WO_3$ 1 to 6 parts by mass, and $CeO_2$ 2.5 to 6 parts by mass, or two kinds of $Fe_2O_3$ and $Sb_2O_3$ are contained by $Fe_2O_3$ 0.6 to 5 parts by mass+$Sb_2O_3$ 0.1 to 5 parts by mass, or two kinds of $V_2O_5$ and $CeO_2$ are contained by $V_2O_5$ 0.01 to 0.5 parts by mass+$CeO_2$ 1 to 6 parts by mass, relative to 100 parts by mass of the CuO-containing glass.

[Absorption Layer]

The absorption layer contains a near-infrared absorbing dye (A) and a transparent resin (B), and typically is a layer or a (resin) substrate such that the near-infrared absorbing dye (A) is evenly dissolved or dispersed in the transparent resin (B). The absorption layer further preferably contains an ultraviolet absorbing dye (U). Further, as the absorption layer, a plurality of absorption layers may be provided as described previously.

In the present filter, the thickness of the absorption layer (in the case of the absorption layer being constituted of a plurality of layers, the total thickness of the layers) is preferred to be 0.1 to 100 μm. When the thickness is less than 0.1 μm, it is possible that a desired optical characteristic cannot be exhibited sufficiently, and when the thickness is greater than 100 μm, flatness of the layer decreases and it is possible that in-plane dispersion of absorptance occurs. The thickness of the absorption layer is more preferred to be 0.3 to 50 μm. Further, when another functional layer such as an anti-reflection layer is provided, it is possible that the absorption layer is too thick, thus causing cracks depending on a material of the functional layer, so that the thickness of the absorption layer is preferred to be 0.3 to 10 μm.

(Near-Infrared Absorbing Dye (A))

The near-infrared absorbing dye (A) (hereinafter also referred to as dye (A)) contains one kind or a combination of two or more kinds of a dye with an absorption characteristic measured by dissolved in dichloromethane satisfying (i-1) to (i-3).

(i-1) In an absorption spectrum of a wavelength of 400 to 800 nm, there is a maximum absorption wavelength $\lambda_{max}$ in a wavelength of 670 to 730 nm. In (i-1), $\lambda_{max}$ preferably exists in a wavelength of 680 to 730 nm, more preferably exists in a wavelength of 680 to 720 nm, and further preferably exists in a wavelength of 690 to 720 nm.

(i-2) Between a maximum absorption coefficient $\varepsilon_A$ of light with a wavelength of 430 to 550 nm and a maximum absorption coefficient $\varepsilon_B$ of light with a wavelength of 670 to 730 nm, the following relational expression is established.

$$\varepsilon_B/\varepsilon_A \geq 65$$

It is preferably $\varepsilon_B/\varepsilon_A \leq 70$, more preferably $\varepsilon_B/\varepsilon_A \geq 80$, and further preferably $\varepsilon_B/\varepsilon_A \geq 85$.

(i-3) In a spectral transmittance curve, a difference $\lambda_{max}-\lambda_{80}$ between a wavelength $\lambda_{80}$ with which the transmittance becomes 80% on a shorter wavelength side than $\lambda_{max}$ with the transmittance at $\lambda_{max}$ set to 10% and $\lambda_{max}$ is 65 nm or less. $\lambda_{max}-\lambda_{80}$ is preferred to be 60 nm or less, and more preferred to be 55 nm or less.

By using the dye satisfying (i-1) to (i-3), it is possible to obtain an optical filter having an increased visible light transmittance, particularly an increased transmittance of light with a wavelength of 430 to 550 nm while having a good near-infrared blocking characteristic. Specifically, satisfying (i-1) makes it possible to sufficiently block predetermined near-infrared light. Satisfying (i-2) makes it possible to increase the transmittance of the light with a wavelength of 430 to 550 nm in particular. Satisfying (i-3) makes it possible to make change in the vicinity of a boundary between the visible region and the near-infrared region steep.

The dye (A) is preferably constituted of only a dye satisfying (i-1) to (i-3), and only one kind preferably satisfies (i-1) to (i-3). A dye of this kind that satisfies (i-1) to (i-3) is called a dye (A1).

As the dye (A1), a squarylium-based dye represented by formula (AI) or formula (AII) is cited. In this description, the dye represented by formula (AI) is also called a dye (AI), the dye represented by formula (AII) is also called a dye (AII), and the same is true of other dyes. Further, as will be described later, a group represented by formula (1n) is also described as a group (In), and groups represented by other formulae are also described in the same manner.

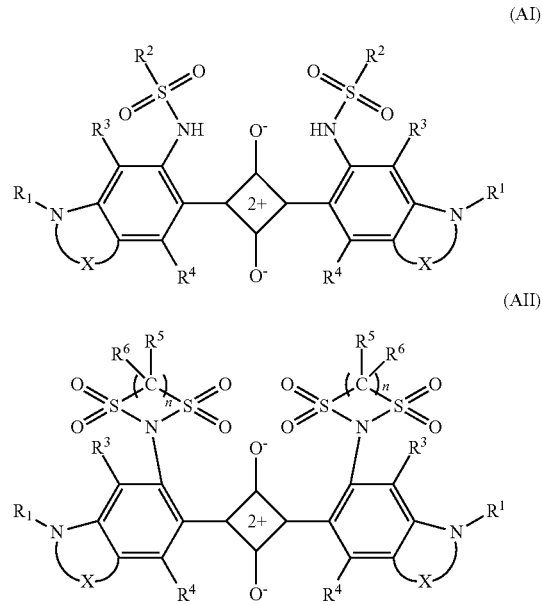

where symbols in formula (AI) and formula (AII) are as follows:

X is independently a bivalent organic group represented by formula (1) or formula (2), in which one or more hydrogen atoms may be substituted with a halogen atom, or an alkyl group or alkoxy group having 1 to 12 carbon atoms;

$$-(CH_2)_{n1}- \quad (1)$$

in formula (1), $n1$ is 2 or 3;

$$-(CH_2)_{n2}-O-(CH_2)_{n3}- \quad (2)$$

in formula (2), $n2$ and $n3$ are both independently an integer of 0 to 2, and $n2+n3$ is 1 or 2;

$R^1$ independently represents a saturated or unsaturated hydrocarbon group having 1 to 12 carbon atoms that may have a branch and may contain a saturated ring structure, a saturated cyclic hydrocarbon group having 3 to 12 carbon atoms, an aryl group having 6 to 12 carbon atoms, or an alaryl group having 7 to 13 carbon atoms;

$R^2$ is independently a hydrocarbon group having 1 to 25 carbon atoms in which one or more hydrogen atoms may be substituted with a halogen atom, a hydroxy group, a carboxy group, a sulfo group, or a cyano group and that may contain an unsaturated bond, an oxygen atom, or a saturated or unsaturated ring structure between carbon atoms;

$R^3$, $R^4$, R, and $R^6$ independently represent a hydrogen atom, a halogen atom, or an alkyl group or alkoxy group having 1 to 10 carbon atoms; and n is 2 or 3.

Note that in this description, the saturated or unsaturated ring structure refers to a hydrocarbon ring and a heterocycle having an oxygen atom as an atom constituting the ring. Further, a structure in which an alkyl group having 1 to 10 carbon atoms is bonded to a carbon atom constituting a ring is also included in a category of the saturated or unsaturated ring structure. Further, the aryl group refers to a group that is bonded via a carbon atom constituting an aromatic ring included in an aromatic compound, for example, a benzene ring, a naphthalene ring, biphenyl, a furan ring, a thiophene ring, a pyrrole ring, or the like. The alaryl group refers to a linear or branched, saturated or unsaturated hydrocarbon group which may contain a saturated ring structure, or a saturated cyclic hydrocarbon group, which is substituted with one or more aryl groups.

The dye (AI) and the dye (AII) have a squarylium skeleton in a center of a molecular structure and have one condensed ring structure on each of the left and right sides such that one benzene ring is bonded to each of the left and right sides of the squarylium skeleton, each benzene ring thereof is bonded to a nitrogen atom at a fourth position, and a heterocycle is formed including the nitrogen atom and the fourth-position and fifth-position carbon atoms of the benzene ring. Further, the dye (AI) is bonded to a sulfonamide group, which is represented by formula (a1), in the second position of the one benzene ring on each of the left and right sides, and the dye (AII) is bonded to a sulfonamide group, which is represented by formula (a2), in the second position of the one benzene ring on each of the left and right sides. In formulae (a1) and (a2), $R^2$, $R^5$, $R^6$ and n are of the same meaning as $R^2$, $R^5$, $R^6$ and n in formulae (AI) and (AII).

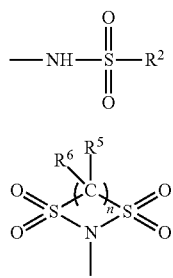

(a1)

(a2)

In the dye (AI) and the dye (AII), the structure of the ring other than the benzene ring constituting the condensed ring structure existing one each on the left and right sides is determined by X, and is each independently a heterocycle having 5 or 6 members. The bivalent group X constituting part of the heterocycle may have a skeleton constituted of only carbon atoms as represented in formula (1), or may contain oxygen atoms as represented in formula (2). In formula (2), the position of the oxygen atom is not particularly limited. That is, a nitrogen atom and an oxygen atom may be bonded, or an oxygen atom may be bonded directly to the benzene ring. Further, an oxygen atom may be positioned so as to be sandwiched by carbon atoms.

X on the left and right sides may be the same or different, and from the viewpoint of productivity, they are preferred to be the same. Further, $R^1$ to $R^6$ may be the same or different on the left and right sides across the squarylium skeleton, and from the viewpoint of productivity, they are preferred to be the same.

In the dye (AI) and the dye (AII), as described above, the sulfonamide group is bonded in the second position of the benzene rings bonded on the left and right sides of the squarylium skeleton, and thereby the transmittance of light in the visible region, particularly of light with a wavelength of 430 to 550 nm is more increased while having a spectral transmittance characteristic in the near-infrared region, which is equivalent to that of a conventional squarylium-based dye. This is thought because the sulfonamide group is used as a bond group to the benzene ring, thereby enabling suppression of a decrease in electron density of the nitrogen atom. Further, the sulfonamide group is a stable bond group, thus also increasing stability with respect to heat and light. Further, solubility to the resin is also not impaired, thus also enabling use as a dyestuff.

Of the dye (AI) and the dye (AII), solubility to an organic solvent is good, and therefore their compatibility to the transparent resin is also good. As a result, even when the thickness of the absorption layer is made thin, the optical filter has an excellent spectral characteristic, resulting in that the optical filter can be reduced in size and thickness. Further, the thickness of the absorption layer can be made thin, so that it is possible to suppress thermal expansion of the absorption layer by heating, and at the time of forming a reflection layer and, for example, an anti-reflection layer, suppress occurrence of cracks or the like in these layers. That is, at the time of forming a reflection layer, an anti-reflection layer, and the like, a heat treatment is sometimes performed depending on their materials, and when the thickness of the absorption layer is thick, there is a risk that cracks or the like occur in these layers by expansion of the absorption layer during the heat treatment. Further, from the viewpoint of solubility to an organic solvent and compatibility to the transparent resin, a substituent $R^1$ is preferred to be a group having a branch structure.

The dye (AI) and the dye (AII) each contain the sulfonamide group, thus being good also in heat resistance, and thus even on the occasion of the heat treatment or the like of a reflection layer, an anti-reflection layer, and the like, their performance deterioration can be suppressed. Further, also from the viewpoint of heat resistance, the substituent $R^1$ is preferred to be a group having a branch structure.

Further, the dye (AI) and the dye (AII) are also good in light resistance. From the viewpoint of light resistance, the group to be bonded to an S atom of the sulfonamide group is preferred to be an alkyl group or an alkoxy group, and preferred to be an alkyl group or alkoxy group having 1 to 12 carbon atoms in particular.

X in the dye (AI) and the dye (AII) is preferred to be a bivalent organic group represented by formula (3).

formula (3) represents a bivalent group in which the left side is bonded to the benzene ring and the right side is bonded to N, and n4 is 1 or 2. n4 is preferred to be 1. $R^7$ is independently an alkyl group or alkoxy group having 1 to 12 carbon atoms that may have a branch, and preferred to be an alkyl group or alkoxy group having 1 to 6 carbon atoms that may have a branch. $R^8$ is independently a hydrogen atom or an alkyl group or alkoxy group having 1 to 12 carbon atoms that may have a branch, and preferred to be a hydrogen atom or an alkyl group or alkoxy group having 1 to 6 carbon atoms that may have a branch.

X is particularly preferred to be one of bivalent organic groups represented by formulae (11-1) to (12-3). formula (11-1) to formula (12-3) each represent a bivalent group in which the left side is bonded to the benzene ring and the right side is bonded to N.

 (11-1)

 (11-2)

 (11-3)

 (11-4)

 (11-5)

—C(CH$_3$)$_2$—C(CH$_3$)(CH(CH$_3$)$_2$)— (11-6)

—C(CH$_3$)$_2$—CH$_2$—CH$_2$— (12-1)

—C(CH$_3$)$_2$—CH$_2$—CH(CH$_3$)— (12-2)

—C(CH$_3$)$_2$—CH(CH$_3$)—CH$_2$— (12-3)

Among them, X is preferred to be one of the groups (11-1) to (11-6).

Structural formulae of a dye (Ai) and a dye (Aii) in which X is constituted of preferable groups are given below. In formulae (Ai) and (Aii), R$^1$ to R$^6$ and n are of the same meaning as R$^1$ to R$^6$ and n in formulae (AI) and (AII). Further, R$^{a2}$ and R$^{22}$ are an alkyl group or alkoxy group having 1 to 6 carbon atoms that may have a branch, and R$^{23}$ and R$^{24}$ are a hydrogen atom or an alkyl group or alkoxy group having 1 to 6 carbon atoms that may have a branch.

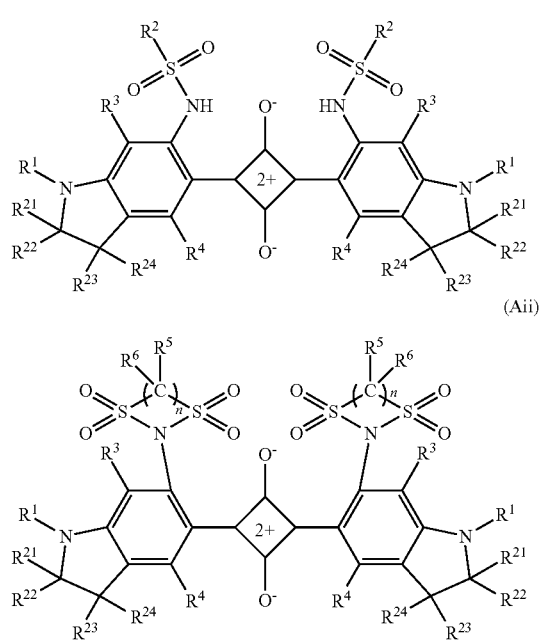

R$^1$ in the dye (AI) and the dye (AII), from the viewpoint of solubility, heat resistance, and further steepness of change in the vicinity of a boundary between the visible region and the near-infrared region in the spectral transmittance curve, is independently more preferred to be a group represented by formula (4-1) or formula (4-2).

In formula (4-1) and formula (4-2), R$^{11}$, R$^{12}$, R$^{13}$, R$^{14}$, and R$^{15}$ independently represent a hydrogen atom, a halogen atom or an alkyl group having 1 to 4 carbon atoms.

R$^3$ and R$^4$ in the dye (AI) and the dye (AII) are independently preferred to be a hydrogen atom, a halogen atom or an alkyl group or alkoxy group having 1 to 6 carbon atoms, and are both more preferred to be hydrogen atoms.

R$^2$ in the dye (AI) is, from the viewpoint of light resistance, independently preferred to be an alkyl group or alkoxy group having 1 to 12 carbon atoms that may have a branch, or a hydrocarbon group having 6 to 16 carbon atoms that has an unsaturated ring structure. Examples of the unsaturated ring structure include benzene, toluene, xylene, furan, benzofuran, and the like. R$^2$ is independently more preferred to be an alkyl group or alkoxy group having 1 to 12 carbon atoms that may have a branch.

R$^5$ and R$^6$ in the dye (AI) do not greatly increase a molecular weight, and from the viewpoint of an added amount, reactivity to squarylium, solubility to resin, and the like, are more preferred to be a hydrogen atom, a fluorine atom, or an alkyl group having 1 to 5 carbon atoms.

As the dye (A1), the dye (Ai) or the dye (Aii) is more preferred, and furthermore, dyes (A1-1) to (A1-26) having a constitution illustrated in Tables 1, 2 are further preferred. Further, from the viewpoint of solubility of the dye, heat resistance, and steepness of change in the vicinity of a boundary between the visible region and the near-infrared region in the spectral transmittance curve, the dyes (A1-9) to (A1-26) are preferred, and when further considering light resistance of the dye, the dyes (A1-10), (A1-13), (A1-15), (A1-21), and (A1-24) to (A1-26) are particularly preferred. Note that in the dyes (A1-1) to (A1-26), two R$^1$s in total existing one each on the left and right sides are the same on the left and right sides, and the same is true of R$^2$ to R$^6$, and R$^{21}$ to R$^{24}$.

TABLE 1

| Dye | Structural formula | R$^1$ | R$^2$ | R$^3$ | R$^4$ | n | R$^5$ | R$^6$ | R$^{21}$ | R$^{22}$ | R$^{23}$ | R$^{24}$ |
|---|---|---|---|---|---|---|---|---|---|---|---|---|
| (A1-1) | (Ai) | —CH$_3$ | —CH$_2$(CH$_2$)$_6$CH$_3$ | H | H | — | — | — | H | —CH$_3$ | —CH$_3$ | —CH$_3$ |
| (A1-2) | | —CH$_3$ | —CF$_3$ | H | H | — | — | — | H | —CH$_3$ | —CH$_3$ | —CH$_3$ |
| (A1-3) | | —CH$_3$ | —CF$_2$(CF$_2$)$_2$CF$_3$ | H | H | — | — | — | H | —CH$_3$ | —CH$_3$ | —CH$_3$ |
| (A1-4) | | —CH$_3$ | CF$_3$-phenyl | H | H | — | — | — | H | —CH$_3$ | —CH$_3$ | —CH$_3$ |

TABLE 1-continued

| Dye | Structural formula | R¹ | R² | R³ | R⁴ | n | R⁵ | R⁶ | R²¹ | R²² | R²³ | R²⁴ |
|---|---|---|---|---|---|---|---|---|---|---|---|---|
| (A1-5) | | —CH₃ | 2,3-dimethylphenyl | H | H | — | — | — | H | —CH₃ | —CH₃ | —CH₃ |
| (A1-6) | | —CH₃ | 4-(CH₂CH₂CH₃)phenyl | H | H | — | — | — | H | —CH₃ | —CH₃ | —CH₃ |
| (A1-7) | | —CH₃ | 4-(CH₂(CH₂)₃CH₃)phenyl | H | H | — | — | — | H | —CH₃ | —CH₃ | —CH₃ |
| (A1-8) | | —CH₃ | 4-(CF₃)phenyl | H | H | — | — | — | H | —CH₃ | —CH₃ | —CH₃ |
| (A1-9) | | —CH(CH₃)₂ | —CF₃ | H | H | — | — | — | H | —CH₃ | —CH₃ | —CH₃ |
| (A1-10) | | —CH(CH₃)₂ | —C(CH₃)₃ | H | H | — | — | — | H | —CH₃ | —CH₃ | —CH₃ |
| (A1-11) | | —CH(CH₃)₂ | 4-F-phenyl | H | H | — | — | — | H | —CH₃ | —CH₃ | —CH₃ |
| (A1-12) | | —CH(CH₃)₂ | 4-CH₃-phenyl | H | H | — | — | — | H | —CH₃ | —CH₃ | —CH₃ |
| (A1-13) | | —CH(CH₃)₂ | —CH₂CH₂CH₃ | H | H | — | — | — | H | —CH₃ | —CH₃ | —CH₃ |

TABLE 2

| Dye | Structural formula | R¹ | R² | R³ | R⁴ | n | R⁵ | R⁶ | R²¹ | R²² | R²³ | R²⁴ |
|---|---|---|---|---|---|---|---|---|---|---|---|---|
| (A1-14) | (Ai) | —CH(CH₃)₂ | 4-(CH₂CH₂CH₃)phenyl | H | H | — | — | — | H | —CH₃ | —CH₃ | —CH₃ |
| (A1-15) | | —CH(CH₃)₂ | —CH₂(CH₂)₆CH₃ | H | H | — | — | — | H | —CH₃ | —CH₃ | —CH₃ |
| (A1-16) | | —CH(CH₃)₂ | 4-(CF₃)phenyl | H | H | — | — | — | H | —CH₃ | —CH₃ | —CH₃ |
| (A1-17) | | —CH(CH₃)₂ | —CF₂(CF₂)₂CF₃ | H | H | — | — | — | H | —CH₃ | —CH₃ | —CH₃ |
| (A1-18) | | —CH(CH₃)₂ | 2-CH₃-phenyl | H | H | — | — | — | H | —CH₃ | —CH₃ | —CH₃ |
| (A1-19) | | —CH(CH₃)₂ | 4-(CH₂(CH₂)₃CH₃)phenyl | H | H | — | — | — | H | —CH₃ | —CH₃ | —CH₃ |
| (A1-20) | (Aii) | —CH(CH₃)₂ | —CF₂(CF₂)₂CF₃ | H | H | 2 | F | F | H | —CH₃ | —CH₃ | —CH₃ |
| (A1-21) | (Ai) | —C(CH₃)₂CH₂CH₃ | —CH₂(CH₂)₆CH₃ | H | H | — | — | — | H | —CH₃ | —CH₃ | —CH₃ |
| (A1-22) | | —C(CH₃)₂CH₂CH₃ | —CF₃ | H | H | — | — | — | H | —CH₃ | —CH₃ | —CH₃ |

TABLE 2-continued

| Dye | Structural formula | $R^1$ | $R^2$ | $R^3$ | $R^4$ | n | $R^5$ | $R^6$ | $R^{21}$ | $R^{22}$ | $R^{23}$ | $R^{24}$ |
|---|---|---|---|---|---|---|---|---|---|---|---|---|
| (A1-23) | | —C(CH$_3$)$_2$CH$_2$CH$_3$ | —CF$_2$(CF$_2$)$_2$CF$_3$ | H | H | — | — | — | H | —CH$_3$ | —CH$_3$ | —CH$_3$ |
| (A1-24) | | —CH(CH$_3$)$_2$ | —CH$_2$(CH$_2$)$_6$CH$_3$ | H | H | — | — | — | —CH$_3$ | —CH$_3$ | —CH$_3$ | —CH$_3$ |
| (A1-25) | | —CH(CH$_3$)$_2$ | —CH$_2$(CH$_2$)$_6$CH$_3$ | H | H | — | — | — | —CH$_3$ | —C$_2$H$_5$ | —CH$_3$ | —CH$_3$ |
| (A1-26) | | —CH(CH$_3$)$_2$ | —CH$_2$(CH$_2$)$_6$CH$_3$ | H | H | — | — | — | —CH$_3$ | —CH(CH$_3$)$_2$ | —CH$_3$ | —CH$_3$ |

The above-described dye (AI) and dye (AII) can be produced by conventionally publicly known methods, for example, the methods described in US Patent Application Publication No. 2014/0061505 and International Publication Pamphlet No. WO14/088063. Specifically, the dye (AI) can be produced by causing a reaction of 3,4-dihydroxy-3-cyclobutene-1,2-dione (squaric acid) with a compound having a condensed ring that can form the structure represented by formula (AI) by bonding to the squaric acid. Further, the dye (AII) can be produced by causing a reaction of squaric acid with a compound having a condensed ring that can form the structure represented by formula (AII) by bonding to the squaric acid. For example, when the dye (AI) has a bilaterally symmetrical structure, it is only necessary to cause a reaction of the compound with equivalent weight of 2 having a condensed ring of a desired structure in the above-described range with the squaric acid with equivalent weight of 1.

Hereinafter, as a specific example, a reaction path when the dye (Ai) (where $R^{21}$ is a hydrogen atom and $R^{22}$ to $R^{24}$ are methyl groups) is obtained will be described. The squaric acid is represented by (s) in reaction formula (F1). According to reaction formula (F1), an amino group is introduced (f) into a benzene ring of a compound (d) having desired substituents ($R^1$, $R^3$, $R^4$) in an indole skeleton, and a sulfonyl chloride (g) having a desired substituent $R^2$ is made to react therewith, thereby obtaining a sulfonamide compound (h). The sulfonamide compound (h) with equivalent weight of 2 is made to react with the squaric acid (s) with equivalent weight of 1, thereby obtaining the dye (Ai).

(F1)

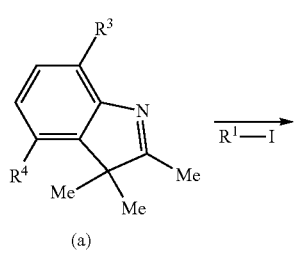

(a)

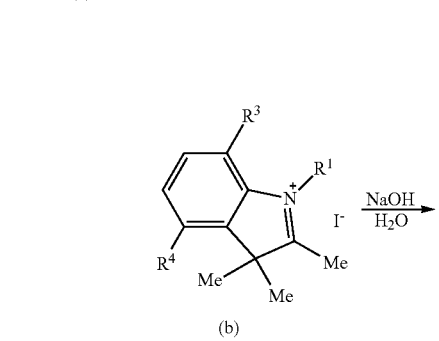

(b)

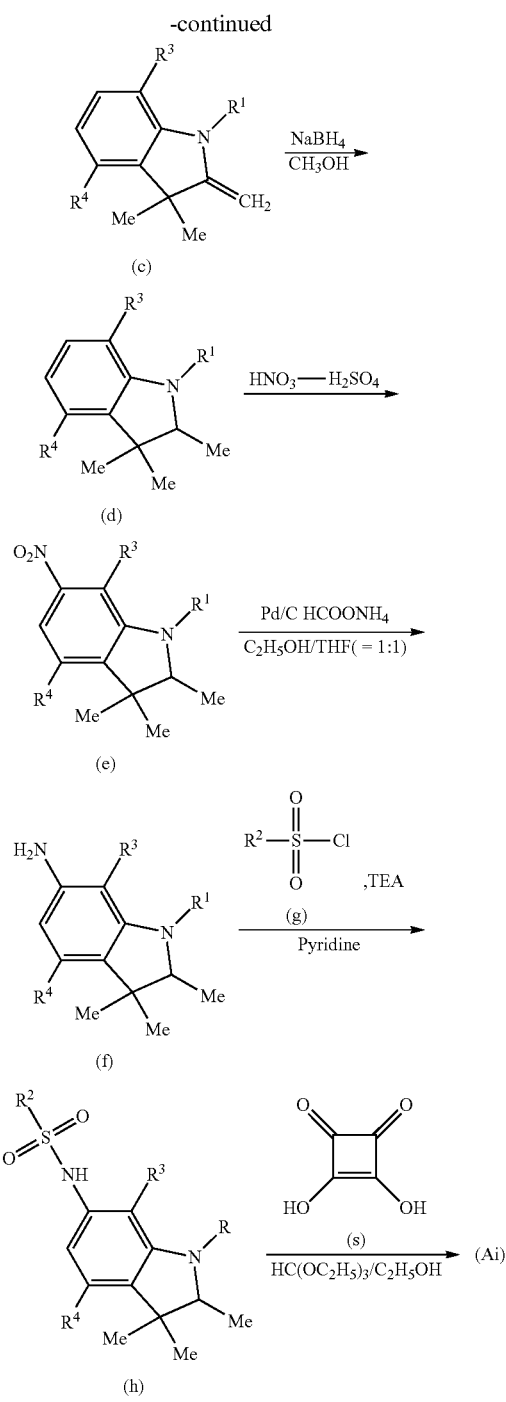

In reaction formula (F1), $R^1$ to $R^4$ are of the same meaning as $R^1$ to $R^4$ in formula (Ai), Me represents a methyl group and THF represents tetrahydrofuran. Hereinafter, in this description, Me and THF are used by the same meanings as described above.

In this embodiment, as the dye (A), one kind of the dye (A1) may be used solely, or two or more kinds may be used in combination. A NIR dye other than the dye (A1) may be contained in the dye (A), and only the dye (A1) is preferably used.

The content of the dye (A) in the absorption layer is preferred to be 0.1 to 30 parts by mass relative to 100 parts by mass of the transparent resin (B). Having 0.1 parts by mass or more enables obtaining a desired near-infrared absorbing capability, and having 30 parts by mass or less suppresses a decrease in near-infrared absorbing capability, an increase in haze value, and the like. The content is more preferred to be 0.5 to 25 parts by mass, and further preferred to be 1 to 20 parts by mass.

(Ultraviolet Absorbing Dye (U))

As the ultraviolet absorbing dye (U) (hereinafter, also referred to as dye (U)), one satisfying (ii-1) is preferred.

(ii-1) In an absorption spectrum (hereinafter, referred to as "absorption spectrum of the dye (U)") of a wavelength of 350 to 800 nm measured by dissolved in dichloromethane, there is a maximum absorption wavelength in a wavelength of 360 to 415 nm.

Using the dye (U) satisfying (ii-1) makes it possible to obtain a good ultraviolet blocking characteristic without decreasing the transmittance of the light with a wavelength of 430 nm or more because the maximum absorption wavelength has appropriate and steep rising of the absorption spectrum. In the absorption spectrum of the dye (U), the maximum absorption wavelength of the dye (U) more preferably exists in the wavelength of 370 to 415 nm, and further preferably exists in the wavelength of 390 to 410 nm.

Specific examples of a dye (hereinafter, referred to as dye (U1)) satisfying (ii-1), which is suitable for this embodiment, include dyes of oxazole-based, merocyanine-based, cyanine-based, naphthalimide-based, oxadiazole-based, oxazine-based, oxazolidine-based, naphthalic acid-based, styryl-based, anthracene-based, cyclic carbonyl-based, triazole-based, and the like.

As commercial products, there are cited, for example, as the oxazole-based dye, Uvitex (registered trademark) OB (product name, made by Ciba), Hakkol (registered trademark) RF-K (product name, made by Showa Chemical Industry Co., Ltd.), Nikkafluor EFS, Nikkafluor SB-conc (product name, both being made by Nippon Chemical Industrial CO., LTD.), and the like. Examples of the merocyanine-based dye include S0511 (product name, made by Few Chemicals), and the like. Examples of the cyanine-based dye include SMP370, SMP416 (product name, both being made by Hayashibara Co., Ltd.), and the like. Examples of the naphthalimide-based dye include Lumogen (registered trademark) F violet 570 (product name, made by BASF), and the like.

As the dye (U1), a dye represented by General formula (N) (dye (N)) is also cited.

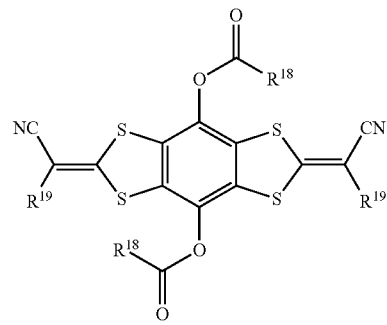
(N)

In formula (N), $R^{18}$ each independently represent a hydrocarbon group having 1 to 20 carbon atoms that may contain a saturated or unsaturated ring structure and may have a branch. Specific examples include a linear or branched alkyl group, an alkenyl group, a saturated cyclic hydrocarbon group, an aryl group, and an alaryl group, and the like. Further, in formula (N), $R^{19}$ are each independently a cyano group or a group represented by formula (n).

(n)

In formula (n), $R^{30}$ represents a hydrocarbon group having 1 to 20 carbon atoms that may contain a saturated or unsaturated ring structure and may have a branch. Specific examples include a linear or branched alkyl group, an alkenyl group, a saturated cyclic hydrocarbon group, an aryl group, and an alaryl group, and the like.

As $R^{18}$ in the dye (N), among others, groups represented by formulae (1n) to (4n) are preferred. Further, as $R^{19}$ in the dye (N), among others, a group represented by formula (5n) is preferred.

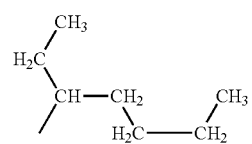
(1n)

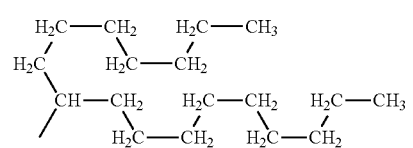
(2n)

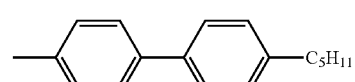
(3n)

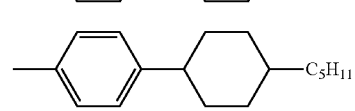
(4n)

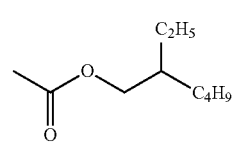
(5n)

As specific examples of the dye (N), dyes (N-1) to (N-4) having a constitution illustrated in Table 3 can be exemplified. Note that specific structures of $R^{18}$ and $R^{19}$ in Table 3 correspond to formulae (1n) to (5n). Corresponding dye symbols are also illustrated in Table 3. Note that in the dyes (N-1) to (N-4), two $R^{18}$s existing are the same, and $R^{19}$s are the same as well.

TABLE 3

| Dye abbreviation | $R^{18}$ | $R^{19}$ |
|---|---|---|
| N-1 | 1n | 5n |
| N-2 | 2n | 5n |
| N-3 | 3n | 5n |
| N-4 | 4n | 5n |

Among the dyes (U1) exemplified above, the dyes of oxazole-based and merocyanine-based are preferred, and as commercial products thereof for example, Uvitex (registered trademark) OB, Hakkol (registered trademark) RF-K, and S0511 are cited.

(Merocyanine-Based Dye)

As the dye (U1), a merocyanine-based dye represented by general formula (M) is particularly preferred.

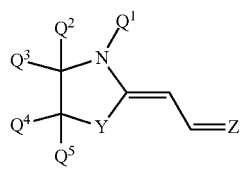
(M)

In formula (M), Y represents an oxygen atom or a substituted or unsubstituted methylene group in which $Q^6$ and $Q^7$ are bonded to a carbon atom. Here, $Q^6$ and $Q^7$ both independently represent a hydrogen atom, a halogen atom, or an alkyl group or alkoxy group having 1 to 10 carbon atoms. $Q^6$ and $Q^7$ both are independently preferred to be hydrogen atoms or alkyl groups or alkoxy groups having 1 to 10 carbon atoms, and it is more preferred that both are hydrogen atoms or at least one of them is a hydrogen atom and the other is an alkyl group having 1 to 4 carbon atoms. Particularly preferably, $Q^6$ and $Q^7$ both are hydrogen atoms.

$Q^1$ represents a monovalent hydrocarbon group having 1 to 12 carbon atoms that may have a substituent. The monovalent hydrocarbon group is preferred to be an alkyl group having 1 to 12 carbon atoms in which part of hydrogen atoms may be substituted with an aliphatic ring, an aromatic ring or an alkenyl group, a cycloalkyl group having 3 to 8 carbon atoms in which part of hydrogen atoms may be substituted with an aromatic ring, an alkyl group or an alkenyl group, and an aryl group having 6 to 12 carbon atoms in which part of hydrogen atoms may be substituted with an aliphatic ring, an alkyl group or an alkenyl group. When $Q^1$ is an alkyl group having no substituent, this alkyl group may be of either linear chain or branched chain, and the number of carbon atoms thereof is more preferred to be 1 to 6.

As the alkyl group having 1 to 12 carbon atoms in which part of hydrogen atoms are substituted with an aliphatic ring, an aromatic ring, or an alkenyl group, an alkyl group having 1 to 4 carbon atoms having a cycloalkyl group having 3 to 6 carbon atoms and an alkyl group having 1 to 4 carbon atoms that is substituted with a phenyl group are more preferred, and an alkyl group having 1 or 2 carbon atoms that is substituted with a phenyl group is particularly preferred.

Note that the alkyl group substituted with an alkenyl group means one that is an alkenyl group in its entirety and has no unsaturated bond between a first position and a second position, which is, for example, an allyl group or 3-butenyl group, or the like. As the hydrocarbon group having a substituent, a hydrocarbon group having one or more of an alkoxy group, an acyl group, an acyloxy group, a cyano group, a dialkylamino group or a chlorine atom is preferred. The number of carbon atoms of these alkoxy group, acyl group, acyloxy group and dialkylamino group is preferred to be 1 to 6.

Preferred $Q^1$ is an alkyl group having 1 to 6 carbon atoms in which part of hydrogen atoms may be substituted with a cycloalkyl group or a phenyl group. Particularly preferred $Q^1$ is an alkyl group having 1 to 6 carbon atoms, and specifically, there are cited, for example, a methyl group, an ethyl group, a propyl group, an isopropyl group, a butyl group, an isobutyl group, a t-butyl group, and the like.

$Q^2$ to $Q^5$ each independently represent a hydrogen atom, a halogen atom, or an alkyl group or alkoxy group having 1 to 10 carbon atoms. The number of carbon atoms of the alkyl group and the alkoxy group is preferred to be 1 to 6, and more preferred to be 1 to 4. At least one of $Q^2$ and $Q^3$ is preferred to be an alkyl group, and both of them are more preferred to be alkyl groups. When $Q^2$ or $Q^3$ is not an alkyl group, a hydrogen atom is more preferred. Both $Q^2$ and $Q^3$ are particularly preferred to be alkyl groups having 1 to 6 carbon atoms. At least one of $Q^4$ and $Q^5$ is preferred to be a hydrogen atom, and both of them are more preferred to be hydrogen atoms. When $Q^4$ or $Q^5$ is not a hydrogen atom, an alkyl group having 1 to 6 carbon atoms is preferred.

Z represents any of bivalent groups represented by formulae (Z1) to (Z5).

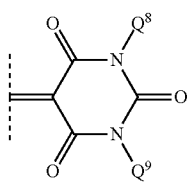
(Z1)

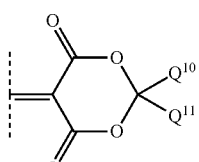
(Z2)

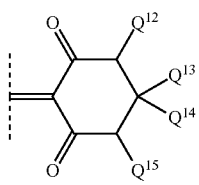
(Z3)

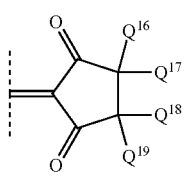
(Z4)

(Z5)

In formulae (Z1) to (Z5), $Q^8$ and $Q^9$ both independently represent monovalent hydrocarbon groups having 1 to 12 carbon atoms that may have a substituent. $Q^8$ and $Q^9$ may be different groups and are preferred to be the same groups.

As the monovalent hydrocarbon group, an alkyl group having 1 to 12 carbon atoms in which part of hydrogen atoms may be substituted with an aliphatic ring, an aromatic ring, or an alkenyl group, a cycloalkyl group having 3 to 8 carbon atoms in which part of hydrogen atoms may be substituted with an aromatic ring, an alkyl group, or an alkenyl group, and an aryl group having 6 to 12 carbon atoms in which part of hydrogen atoms may be substituted with an aliphatic ring, an alkyl group, or an alkenyl group are preferred.

When $Q^8$ and $Q^9$ are an alkyl group having no substituent, this alkyl group may be of either linear chain or branched chain, and the number of carbon atoms thereof is more preferred to be 1 to 6. As the alkyl group having 1 to 12 carbon atoms in which part of hydrogen atoms are substituted with an aliphatic ring, an aromatic ring, or an alkenyl group, an alkyl group having 1 to 4 carbon atoms having a cycloalkyl group having 3 to 6 carbon atoms and an alkyl group having 1 to 4 carbon atoms that is substituted with a phenyl group are more preferred, and an alkyl group having 1 or 2 carbon atoms that is substituted with a phenyl group is particularly preferred. Note that the alkyl group substituted with an alkenyl group means one that is an alkenyl group in its entirety and has no unsaturated bond between a first position and a second position, which is, for example, an allyl group or 3-butenyl group, or the like.

As the monovalent hydrocarbon group having a substituent, a hydrocarbon group having one or more of an alkoxy group, an acyl group, an acyloxy group, a cyano group, a dialkylamino group or a chlorine atom is preferred. The number of carbon atoms of these alkoxy group, acyl group, acyloxy group and dialkylamino group is preferred to be 1 to 6.

Preferred $Q^8$ and $Q^9$ are both alkyl groups having 1 to 6 carbon atoms in which part of hydrogen atoms may be substituted with a cycloalkyl group or a phenyl group. Particularly preferred $Q^8$ and $Q^9$ are both alkyl groups having 1 to 6 carbon atoms, and specifically, there are cited, for example, a methyl group, an ethyl group, a propyl group, an isopropyl group, a butyl group, an isobutyl group, a t-butyl group, and the like.

$Q^{10}$ to $Q^{19}$ each independently represent a hydrogen atom or a monovalent hydrocarbon group having 1 to 12 carbon atoms that may have a substituent. The monovalent hydrocarbon group having 1 to 12 carbon atoms that may have a substituent is a hydrocarbon group similar to the above-described $Q^8$ and $Q^9$. As the monovalent hydrocarbon group having 1 to 12 carbon atoms that may have a substituent, an alkyl group having 1 to 6 carbon atoms that has no substituent is preferred.

$Q^{10}$ and $Q^{11}$ are both more preferred to be alkyl groups having 1 to 6 carbon atoms, and are particularly preferred to be the same alkyl group. $Q^{12}$ and $Q^{15}$ are both preferred to be hydrogen atoms or alkyl groups having 1 to 6 carbon atoms that have no substituent. Any two groups bonded to the same carbon atom ($Q^{13}$ and $Q^{14}$, $Q^{16}$ and $Q^{17}$, $Q^{18}$ and $Q^{19}$) are both preferred to be hydrogen atoms or an alkyl groups having 1 to 6 carbon atoms.

As the compound represented by formula (M), a compound in which Y is an oxygen atom and Z is a group (Z1) or group (Z2), and a compound in which Y is a substituted or unsubstituted methylene group in which $Q^6$ and $Q^7$ are bonded to a carbon atom and Z is a group (Z1) or group (Z5) are preferred. As Z when Y is an oxygen atom, the group (21) or group (Z2) is more preferred in which $Q^1$ is an alkyl group having 1 to 6 carbon atoms, $Q^2$ and $Q^3$ are both a hydrogen atom or an alkyl group having 1 to 6 carbon atoms, and $Q^4$ and $Q^5$ are both a hydrogen atom. The group (Z1) or group (Z2) is particularly preferred in which $Q^1$ is an alkyl group having 1 to 6 carbon atoms, $Q^2$ and $Q^3$ are both an alkyl group having 1 to 6 carbon atoms, and $Q^4$ and $Q^5$ are both a hydrogen atom.

As the compound in which Y is a substituted or unsubstituted methylene group in which $Q^6$ and $Q^7$ are bonded to a carbon atom and Z is the group (Z1) or group (Z5), the group (21) or group (Z5) is preferred in which $Q^1$ is an alkyl group having 1 to 6 carbon atoms, $Q^2$ and $Q^3$ are both a hydrogen atom or an alkyl group having 1 to 6 carbon atoms, and $Q^4$ to $Q^7$ are each a hydrogen atom, and the group (21) or group (Z5) is more preferred in which $Q^1$ is an alkyl group having 1 to 6 carbon atoms and $Q^2$ to $Q^7$ are each a hydrogen atom. As the compound represented by formula (M), the compound in which Y is an oxygen atom and Z is the group (Z1) or group (Z2) is preferred, and a compound in which Y is an oxygen atom and Z is the group (Z1) is particularly preferred.

Specific examples of the dye (M) include compounds represented by formulae (M-1) to (M-11).

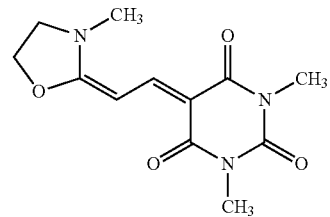

(M-1)

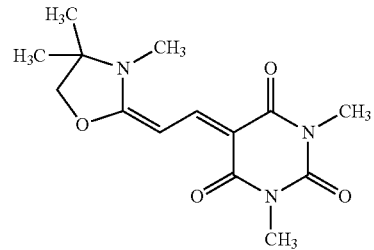

(M-2)

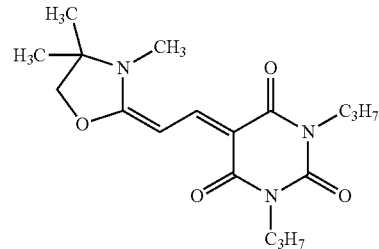

(M-3)

(M-4) 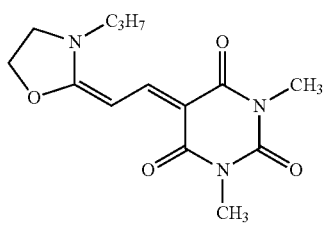

(M-5) 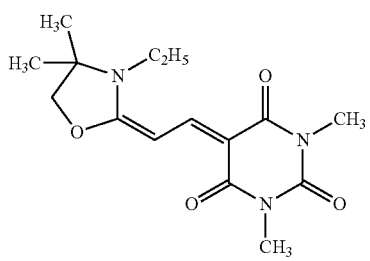

(M-6) 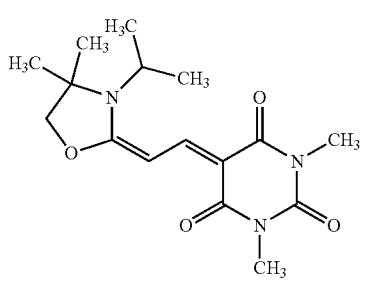

(M-7) 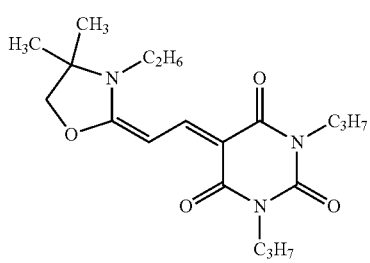

(M-8) 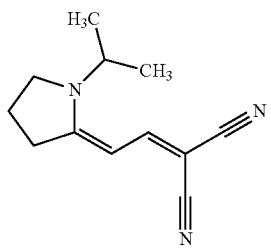

(M-9) 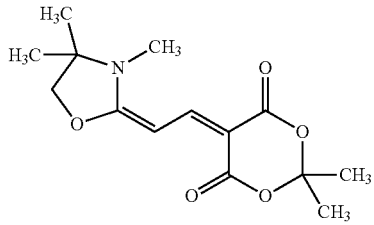

(M-10) 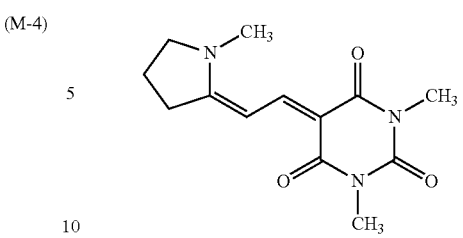

(M-11) 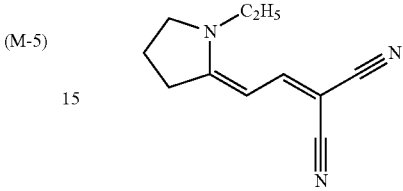

Further, as the dye (U1), ABS407 made by Exiton, UV38IA, UV381B, UV382A, UV386A, or VIS404A made by QCR Solutions Corp., ADA1225, ADA3209, ADA3216, ADA3217, ADA3218, ADA3230, ADA5205, ADA2055, ADA6798, ADA3102, ADA3204, ADA3210, ADA2041, ADA3201, ADA3202, ADA3215, ADA3219, ADA3225, ADA3232, ADA4160, ADA5278, ADA5762, ADA6826, ADA7226, ADA4634, ADA3213, ADA3227, ADA5922, ADA5950, ADA6752, ADA7130, ADA8212, ADA2984, ADA2999, ADA3220, ADA3228, ADA3235, ADA3240, ADA3211, ADA3221, ADA5220, or ADA7158 made by HW Sand Corp., DLS381B, DLS381C, DLS382A, DLS386A, DLS404A, DLS405A, DLS405C, or DLS403A made by Crysta-Lyn Chemical Company, or the like may be used.

In this embodiment, as the dye (U1), one kind selected from a plurality of compounds having an absorption characteristic as the above-described dye (U1) may be used solely or two or more kinds thereof may be used in combination.

The dye (U) preferably contains one kind or two or more kinds of the dyes (U1). The dye (U) may contain an ultraviolet absorbing dye other than the dye (U1), and in the case, the range not impairing the effects of the dye (U1) is preferred.

The content of the dye (U) in the absorption layer is preferably determined so that there is a wavelength with which the transmittance becomes 50% in a wavelength of 400 to 425 nm of the spectral transmittance curve at an incident angle of 0° of the present filter. The dye (U) is preferably contained by 0.01 to 30 parts by mass relative to 100 parts by mass of the transparent resin in the absorption layer, and it is more preferred to be 0.05 to 25 parts by mass and further preferred to be 0.1 to 20 parts by mass.

(Transparent Resin (B))

Specific examples of the transparent resin (B) include an acrylic resin, an epoxy resin, an ene-thiol resin, a polycarbonate resin, a polyether resin, a polyarylate resin, a polysulfone resin, a polyethersulfone resin, a polyparaphenylene resin, a polyarylene ether phosphine oxide resin, a polyimide resin, a polyamide-imide resin, a polyolefin resin, a cyclic olefin resin, and a polyester resin. As the transparent resin (B), one kind may be used solely from these resins, or two or more kinds may be mixed and used.

From the above resins, from the viewpoint of transparency, solubility of the dye (A) and/or the dye (U) to the transparent resin (B), and heat resistance, the transparent resin is preferred to be a resin having a high glass transition point (Tg). Specifically, the transparent resin is preferred to be one or more kinds selected from a polyester resin, a polycarbonate resin, a polyethersulfone resin, a polyarylate resin, a polyimide resin, and an epoxy resin, and more preferred to be one or more kinds selected from a polyester resin and a polyimide resin. The polyester resin is preferred to be a polyethylene terephthalate resin, a polyethylene naphthalate resin, or the like.

As the transparent resin (B), a commercial product may be used, and examples of the acrylic resin include OGSOL (registered trademark) EA-F5003 (product name, made by Osaka Gas Chemicals Co., Ltd.), polymethylmethacrylate and polyisobutylmethacrylate (product name, both being made by Tokyo Chemical Industry Co., Ltd.), BR50 (product name, made by Mitsubishi Rayon Co., Ltd.), and the like.

Further, examples of the polyester resin include OKP4HT, OKP4, B-OKP2, and OKP-850 (product name, all being made by Osaka Gas Chemicals Co., Ltd.), VYLON (registered trademark) 103 (product name, made by TOYOBO Co., Ltd.), and the like, examples of the polycarbonate resin include LeXan (registered trademark) ML9103 (product name, made by sabic), EP5000 (product name, made by MITSUBISHI GAS CHEMICAL COMPANY, INC.), SP3810, SP1516, and TS2020 (product name, all being made by Teijin Chemicals Ltd.), xylex (registered trademark) 7507 (product name, made by sabic), and the like, examples of the cyclic olefin resin include ARTON (registered trademark) (product name, made by JSR Corporation), ZEONEX (registered trademark) (product name, made by ZEON CORPORATION), and the like, and examples of the polyimide resin include Neopulim (registered trademark) C3650, Neopulim (registered trademark) C3630, Neopulim (registered trademark) C3450, and Neopulim (registered trademark) C3G30 (product name, all being made by MITSUBISHI GAS CHEMICAL COMPANY, INC.), JL20 (product name, made by New Japan Chemical Co., Ltd.) (silica may be contained in these polyimide resins), and the like.

(Other Components)

The absorption layer may further contain, within the range not impairing the effects of the present invention, arbitrary components such as a color tone correcting dye, a leveling agent, an antistatic agent, a heat stabilizer, a light stabilizer, an antioxidant, a dispersing agent, a flame retardant, a lubricant, and a plasticizer.

(Absorption Layer)

The absorption layer can be formed by, for example, preparing a coating liquid by dissolving or dispersing the dye (A) (and the dye (U)), and the transparent resin (B) or raw material components of the transparent resin (B), as well as components blended as necessary in a solvent, applying this on a substrate and drying it, and moreover curing it as necessary. The substrate may be a transparent substrate that is applicable as a constituent member of the present filter or a substrate used only when the absorption layer is formed, for example a releasable substrate.

As the solvent for dissolving or dispersing the dye (A), the dye (U), the transparent resin (B), and the like, the solvent is not particularly limited as long as it is a dispersion medium in which the dye (A), the dye (U), and the transparent resin (B) or raw material components of the transparent resin (B), and the like can be dispersed stably or a solvent in which they can be dissolved stably. Note that in this description, the term "solvent" is used as a concept including both the dispersion medium and the solvent.

The coating liquid can contain a surface active agent, and thereby an appearance, particularly voids due to minute bubbles, dents due to adherence of foreign objects or the like, and crawling in a drying process, can be improved. The surface active agent is not particularly limited, and publicly-known ones such as cation-based, anion-based, or nonionic-based agents can be arbitrarily used.

For applying the coating liquid, a coating method such as an immersion coating method, a cast coating method, a spray coating method, a spinner coating method, a bead coating method, a wire bar coating method, a blade coating method, a roller coating method, a curtain coating method, a slit die coater method, a gravure coater method, a slit reverse coater method, a micro gravure method, an inkjet method, or a comma coater method can be used. Other than them, a bar coater method, a screen printing method, a flexographic printing method, or the like can be used.

After the above-described coating liquid is applied on the substrate, it is dried to form the absorption layer, and when the coating liquid contains raw material components of the transparent resin, a curing treatment is further performed. When the reaction is thermosetting, it is possible to simultaneously perform drying and curing, and when it is photosetting, a curing process is provided separately from drying.

Incidentally, even when the present filter includes the transparent substrate as a constituent member, the absorption layer formed by applying the above-described coating liquid on, for example, a releasable support substrate may be removed from the support substrate and caused to adhere on the transparent substrate. The releasable support substrate may be in either film form or plate form.

Further, the absorption layer can be produced in a film shape by extrusion molding depending on the kind of the transparent resin, and moreover, a plurality of films produced in this manner may be stacked and integrated by thermocompression, or the like. When the present filter includes the transparent substrate, they are thereafter caused to adhere on the transparent substrate.

[Reflection Layer]

The reflection layer preferably has a wavelength selection characteristic to transmit visible light and block light having a wavelength other than the light blocking region of the absorption layer. In this case, the light blocking region of the reflection layer may include a light blocking region in the near-infrared region of the absorption layer.

The reflection layer is constituted of a dielectric multilayer film made by alternately stacking a dielectric film with a low-refractive index (low-refractive index film) and a dielectric film with a high-refractive index (high-refractive index film). Examples of high-refractive index film materials include $Ta_2O_5$, $TiO_2$, and $Nb_2O_5$, and among them, $TiO_2$ is preferred from the points of reproducibility, stability, and the like in film formability, a refractive index, and the like. In the meantime, examples of low-refractive index film materials include $SiO_2$, $SiO_xN_y$, and the like, and $SiO_2$ is preferred from the points of reproducibility, stability, economy, and the like in film formability.

The dielectric multilayer film controls transmitting and blocking of light in a specific wavelength region by utilizing interference of light, and there is incident angle dependence in its transmitting and blocking characteristics. In general, the wavelength of light blocked by reflection is a shorter wavelength for light incident obliquely than light incident perpendicularly (incident angle of 0°).

In this embodiment, the reflection layer (dielectric multilayer film) preferably satisfies (iii-1) and (iii-2).

(iii-1) A transmittance of light with a wavelength of 420 to 695 nm is 90% or more in each spectral transmittance curves at incident angles of 0° and 30°. The transmittance of the light with a wavelength of 420 to 695 nm is preferred to be 93% or more, more preferred to be 95% or more, furthermore preferred to be 97% or more.

(iii-2) A transmittance of light with a wavelength of $\lambda_b$ nm to 1100 nm is 1% or less in each spectral transmittance curves at incident angles of 0° and 30° (where $A_b$ is the maximum wavelength with which a transmittance of light with a wavelength of 650 to 800 nm of the absorption layer becomes 1%). The lower the transmittance of the light with a wavelength of $\lambda_b$ nm to 1100 nm is, the more preferred it is, and 0.5% or less is preferred. When the reflection layer satisfies (iii-1) and (iii-2), the present filter can easily obtain a spectral characteristic satisfying (iv-1) to (iv-6).

The reflection layer may have a predetermined selected wavelength blocking characteristic in a single layer (single dielectric multilayer film), or may have a predetermined selected wavelength blocking characteristic in a plurality of layers (plurality of dielectric multilayer films). When a plurality of layers are provided, for example, they may be provided on one main surface side of the transparent substrate, or on both main surface sides of the transparent substrate.

[Anti-Reflection Layer]

Examples of the anti-reflection layer include a dielectric multilayer film, an intermediate refractive index medium, a moth-eye structure having a refractive index that gradually changes, and the like, and from the viewpoint of optical efficiency and productivity, the dielectric multilayer film is preferred.

EXAMPLES

Next, there will be further specifically explained examples of the present invention. Example 1-1 to Example 1-10, Example 2-1 to Example 2-4, Example 3-1 to Example 3-6, and Example 4-1 to Example 4-10 are examples of the present invention, and the other examples are comparative examples.

<Synthesis of Dye>

Dyes (A1-1) to (A1-26) to be used in examples and dyes (A2) to (A9) to be used in comparative examples were synthesized. The dyes (A1-1) to (A1-26) are the dyes described in Tables 1 and 2 described previously and the dyes (A2) to (A9) are dyes represented by formulae (A2) to (A9).

(A2)

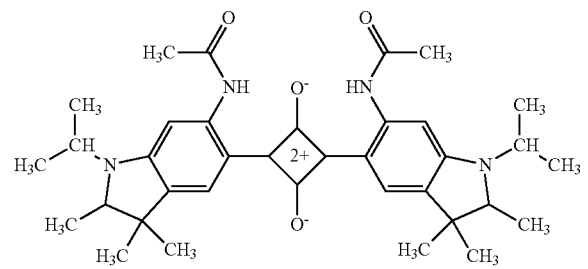

-continued (A3)

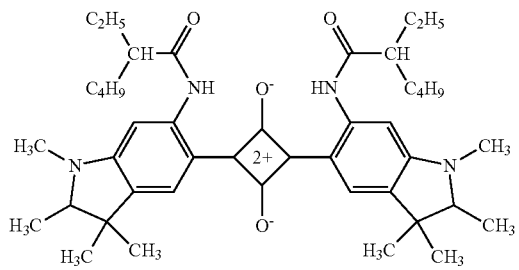

(A4)

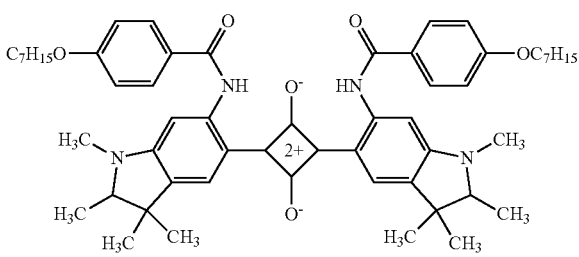

(A5)

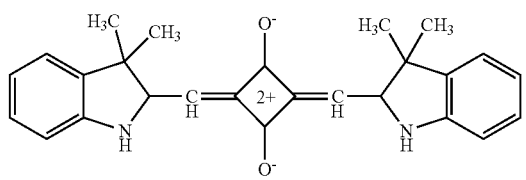

(A6)

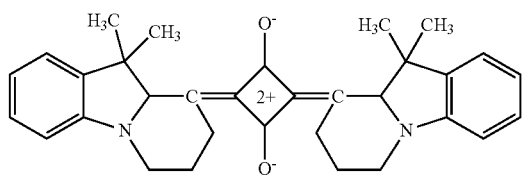

(A7)

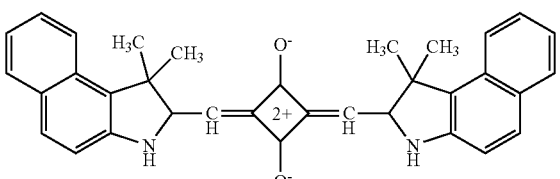

(A8)

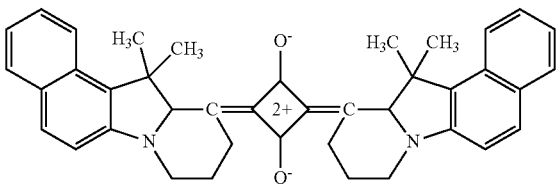

-continued (A9)

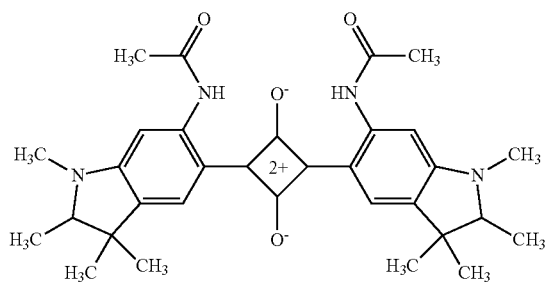

[Production of Dye (A1-15)]

A production example of the dye (A1-15) will be explained specifically below by using reaction formula (F1). In the explanation below, in raw material components ((a), (g)) and intermediate products ((b) to (h)), $R^1$ is an i-propyl group, $R^2$ is an n-$C_8H_{17}$ group, and $R^3$ and $R^4$ are hydrogen atoms.

In the production of the dye (A1-15), a compound (a) in reaction formula (F1) was obtained from Tokyo Chemical Industry Co., Ltd. and used as a starting material.

(Production of Compound (b))

To a 1 L eggplant flask, 31.50 g (0.197 mol) of the compound (a) and 134.6 g (0.79 mol) of iodopropane were added to cause a reaction for 48 hours at 110° C. A red precipitate precipitated to be substantially a solid after a liquid of the iodopropane disappeared in a reaction container. The temperature was returned to room temperature, hexane was added to filter the precipitate. A filtered material was washed again with hexane to be filtered. As a result, a compound (b) (63.9 g, 0.19 mol, 98.0% yield) was obtained.

(Production of Compound (c))

To a 1 L eggplant flask, 63.9 g (0.19 mol) of the compound (b) and 200 ml of water were added, and then a sodium hydride aqueous solution (NaOH 40 g (0.5 mol)+ water 200 ml) was dropped. After the addition, a reaction was brought about for four hours at room temperature, and then extraction was performed with dichloromethane and water and from a dichloromethane layer, a solvent was removed using an evaporator. A condensed organic layer was refined by a column chromatography method. As a result, a liquid compound (c) (33.6 g, 0.17 mol, 98.7% yield) was obtained.

(Production of Compound (d))

To a 1 L eggplant flask, 33.6 g (0.17 mol) of the compound (c) and 700 ml of methanol were added. It was cooled to 0° C. and sodium borohydride (14.76 g, 0.39 mol) was added. After the addition, the temperature was returned to room temperature and a reaction was brought about for four hours. After the reaction was finished, water was added, and thereafter extraction was performed with ethyl acetate and water, and after the extraction, from an obtained organic layer, a solvent was removed using an evaporator. The condensed organic layer was refined by a column chromatography method. As a result, a liquid compound (d) (26.68 g, 0.13 mol, 79.0% yield) was obtained.

(Production of Compound (e))

To a 1 L eggplant flask, 26.68 g (0.13 mol) of the compound (d) was added, and under an ice bath at 0° C., 80 g (0.81 mol) of concentrated sulfuric acid was dropped. After the concentrated sulfuric acid was dropped, stirring was performed for 30 minutes. Thereafter, a mixed solution of 19.19 g of 60% concentrated nitric acid and 60 g of concentrated sulfuric acid was dropped under an ice bath. After the dropping was finished, the reaction temperature was returned gradually to room temperature and a reaction was brought about for 15 hours at the same temperature. After the reaction was finished, it was cooled to 0° C. again and 300 mL of water was added. Further, a 40 mass % aqueous sodium hydroxide solution was dropped until the reaction solution was neutralized. Thereafter, extraction was performed with dichloromethane. An obtained organic layer was dried with magnesium sulfate and a solvent was removed using an evaporator. The condensed organic layer was refined by a column chromatography method. As a result, a liquid compound (e) (26.0 g, 0.12 mol, 82.0% yield) was obtained.

(Production of Compound (f))

To a 2 L eggplant flask, 26.0 (0.10 mol) of the compound (e) and 400 mL of THF were added, and then under an ice bath, 8 g of palladium carbon and 400 mL of ethanol were added in order, and further 93 g (1.48 mol) of ammonium formate was added. Thereafter, a reaction system was opened and stirring was performed under an air atmosphere at room temperature for 12 hours. After a reaction was finished, water was added. The reaction solution was filtered and liquid separation of the filtrate was performed with dichloromethane-water, and then an organic layer was condensed using an evaporator. The condensed organic layer was refined by a column chromatography method. As a result, an oily compound (f) (16.5 g, 0.075 mol, 72% yield) was obtained.

(Production of Compound (h))

To a 2 L eggplant flask, 14.1 g (0.065 mol) of the compound (f) and 180 mL of pyridine were added, and then, 16.5 g (0.078 mol) of sulfonyl chloride having a substituent $R^2$ was dropped. After the dropping was finished, the temperature was returned to room temperature and a reaction was brought about for four hours. After the reaction was finished, water was added and extraction was performed with dichloromethane. An obtained organic layer was dried with sodium sulfate and a solvent was removed using an evaporator, and then the condensed organic layer was refined by a column chromatography method. As a result, a solid compound (h) (25.0 g, 0.073 mol, 97.7% yield) was obtained.

(Production of Dye (A1-15))

A Dean-Stark pipe was attached to a 1 L eggplant flask, 34.0 g (0.086 mol) of the compound (h), 4.85 g (0.042 mol) of squaric acid, 34 mL of triethyl orthoformate, and 400 mL of ethanol were added thereto, and heating and stirring for eight hours were performed at 110° C. After a reaction was finished, a solvent was removed using an evaporator, and then washing was performed with ethyl acetate and refinement was performed by a column chromatography method. As a result, a dye (A1-15) (27.4 g, 0.031 mol, 74.0% yield) was obtained.

[Production of Dyes (A1-10), (A1-12) to (A1-14), (A1-18), (A1-19)]

Dyes (A1-10), (A1-12) to (A1-14), (A1-18), and (A1-19) were produced similarly except that $R^2$ of the sulfonyl chloride (g) having the substituent $R^2$ each are set to $R^2$ illustrated in Tables 1, 2 in the production of the dye (A1-15).

[Production of Dyes (A1-1), (A1-5) to (A1-7)]

Dyes (A1-1), and (A1-5) to (A1-7) were produced similarly except that iodomethane is used in place of the iodopropane and $R^2$ of the sulfonyl chloride (g) having the substituent $R^2$ each are set to $R^2$ illustrated in Table 1 in the production of the dye (A1-15).

[Production of Dye (A1-21)]

A compound (f) (where $R^1$ is an isopentyl group and $R^3$, $R^4$ are hydrogen atoms) in reaction formula (F1) was produced by the method described in International Publication Pamphlet No. WO14/088063 and from this compound (f), a dye (A1-21) was produced via a compound (h) (where $R^1$ is an isopentyl group, $R^2$ is an n-$C_8H_{17}$ group, and $R^3$, $R^4$ are hydrogen atoms) similarly to the case of the dye (A1-15).

[Production of Dye (A1-9)]

A dye (A1-9) was produced similarly to the case of the dye (A1-1) except that from a compound (f) (where $R^1$ is i-$C_3H_7$, and $R^3$, $R^4$ are hydrogen atoms) in reaction formula (F1), a dye (Ai) (where $R^1$ is i-$C_3H_7$, $R^2$ is —$CF_3$, and $R^3$, $R^4$ are hydrogen atoms) is produced as follows via a compound (h) (where $R^1$ is i-C3H7, $R^2$ is —$CF_3$, and $R^3$, $R^4$ are hydrogen atoms).

(Production of Compound (h))

To a 1 L eggplant flask, 14.17 (0.065 mol) of the compound (f) and 180 mL of dichloromethane were added, and then 14.4 g (0.14 mol) of triethylamine was added. Thereafter, it was cooled to 50° C. and 18.5 g (0.066 mol) of anhydrous trifluoroacetic acid was dropped. After the dropping was finished, the temperature was returned to room temperature and a reaction was brought about for four hours. After the reaction was finished, water was added and extraction was performed with dichloromethane. An obtained organic layer was dried with sodium sulfate and a solvent was removed using an evaporator, and then the condensed organic layer was refined by a column chromatography method. As a result, the solid compound (h) (15 g, 0.043 mol, 66.0% yield) was obtained.

(Production of Dye (A1-9))

A Dean-Stark pipe was attached to a 1 L eggplant flask, 12.5 g (0.036 mol) of the compound (h), 2.0 g (0.018 mol) of squaric acid, 2 mL of triethyl orthoformate, and 200 mL of ethanol were added thereto, and heating and stirring for eight hours were performed at 110° C. After a reaction was finished, a solvent was removed using an evaporator, and then washing was performed with ethyl acetate and refinement was performed by a column chromatography method. As a result, the dye (A1-9) (8.6 g, 0.011 mol, 63.0% yield) was obtained.

[Production of Dyes (A1-11), (A1-16), (A1-17)]

Dyes (A1-11), (A1-16), and (A1-17) were produced similarly except that in place of the anhydrous trifluoroacetic acid, a fluorosulfonic acid anhydride having $R^2$ illustrated in Tables 1, 2 is used in the production of the dye (A1-9).

[Production of Dyes (A1-2), (A1-3), (A1-4), (A1-8)]

Dyes (A1-2), (A1-3), (A1-4), and (A1-8) were produced similarly except that in the production of the dye (A1-9), in place of the iodopropane, iodomethane is used, and further in the dyes (A1-3), (A1-4), and (A1-8), in place of the anhydrous trifluoroacetic acid, a fluorosulfonic acid anhydride having $R^2$ illustrated in Table 1 is used.

[Production of Dye (A1-22)]

The compound (f) (where $R^1$ is an isopentyl group and $R^3$, $R^4$ are hydrogen atoms) in reaction formula (F1) was produced by the method described in International Publication Pamphlet No. WO14/088063 and from this compound (f), a dye (A1-22) was produced via a compound (h) (where $R^1$ is an isopentyl group, $R^2$ is —$CF_3$, and $R^3$, $R^4$ are hydrogen atoms) similarly to the case of the dye (A1-9).

[Production of Dye (A1-23)]

A dye (A1-23) was produced similarly except that in the production of the dye (A1-22), in place of the anhydrous trifluoroacetic acid, a fluorosulfonic acid anhydride having $R^2$ illustrated in Table 2 is used.

[Production of Dye (A1-20)]

The following compound described in Journal of fluorine chemistry 133, 11-15, 2012 was made to react with the compound (f) (where $R^1$ is an isopentyl group and $R^3$, $R^4$ are hydrogen atoms) to obtain a sulfonamid, and squaric acid was made to react with this intermediate similarly to the case of the dye (A1-9) to produce a dye (A1-20).

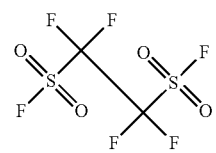 [SMILES: O=S(=O)(F)C(F)(F)C(F)(F)S(=O)(=O)F]

[Production of Dye (A1-24)]

As illustrated below, from a compound (b) (where $R^1$ is an isopropyl group and $R^3$, $R^4$ are hydrogen atoms) in reaction formula (F1), a compound (i) was produced using a Grignard reagent (j) (where $R^2$ is a methyl group), an amino group was introduced into a benzene ring of this compound (i) via a nitration reaction similarly to the case of the dye (A1-15), and further a carboxylic acid sulfone compound (g) (where $R^9$ is an n-$C_8H_{17}$ group) was made to react therewith to obtain a sulfonamide compound, and squaric acid (s) was made to react with this compound to produce a dye (A1-24).

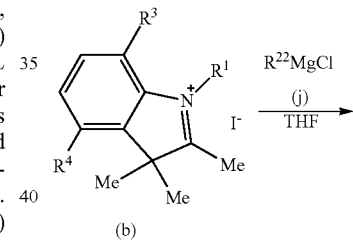

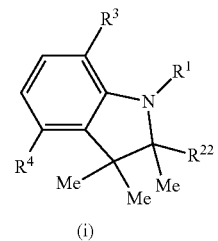

(Production of Compound (i))

A stirrer chip was put into a 2 L three-neck flask, 52.06 g (0.16 mol) of the compound (b) was put thereinto, and a dropping funnel and a cooling pipe were coupled to the three-neck flask. The pressure of the inside of a reactor was reduced and the temperature was increased to 110° C. by an oil bath while performing stirring, and after drying was performed for one hour, the reduced pressure was returned to an ordinary pressure with nitrogen. In a state of the inside of a system being maintained in a nitrogen atmosphere, the reactor was iced, and about 200 mL of tetrahydrofuran was added thereto. Into the dropping funnel, 192 ml (1.2 equivalent weight) of a methylmagnesium chloride.tetrahydrofuran solution (1 mol/L) was put and dropping was performed. After the dropping was finished, the temperature of the reaction system was increased to 80° C. by the oil bath and stirring under reflux was performed for two hours. The reactor was iced, and a 0.5N aqueous hydrochloric acid solution was added until the reaction system became acid and stirring was performed. After heat of neutralization went down, methylene chloride was added, a liquid separation operation was performed, and an organic layer was condensed. The condensed organic layer was refined by a column chromatography method. As a result, the compound (i) (17.31 g, 0.08 mol, 50.0% yield) was obtained.

[Production of Dyes (A1-25), (A1-26)]

Dyes (A1-25) and (A1-26) were produced similarly except that in the production of the dye (A1-24), $R^{22}$ of the Grignard reagent (j) having a substituent $R^2$ are set to an ethyl group and an isopropyl group respectively.

Note that as for the dyes (A2) to (A9) to be used for Comparative examples, the dyes (A2) to (A4), and (A9) were produced by the method described in International Publication Pamphlet No. WO14/088063, and the dyes (A5) to (A8) were produced by the method described in International Publication Pamphlet No. WO11/086785.

<Evaluation of Dye>

(1) Absorption Characteristic of the Dye in Dichloromethane

The dyes obtained above were each dissolved in dichloromethane, and using an ultraviolet-visible spectrophotometer (made by Hitachi High Technologies Co., Ltd., U-4100 type), each spectral transmittance curve was measured, from which a maximum absorption wavelength $\lambda_{max}$, a wavelength $\lambda_{80}$ with which the transmittance becomes 80% on a shorter wavelength side than the maximum absorption wavelength with the transmittance at the maximum absorption wavelength set to 10%, the difference between the maximum absorption wavelength $\lambda_{max}$ and the wavelength $\lambda_{80}$ ($\lambda_{max}-\lambda_{80}$), a maximum absorption coefficient $\varepsilon_A$ in a wavelength of 430 to 550 nm, a maximum absorption coefficient $\varepsilon_B$ in a wavelength of 670 to 730 nm, and a ratio of these ($\varepsilon_B/\varepsilon_A$) were calculated. Results are illustrated in Table 4. Note that measurement of the dye (A9) was not performed because its solubility was low. Further, for each of the following spectral transmittance curves, an ultraviolet-visible spectrophotometer (made by Hitachi High Technologies Co., Ltd., U-4100 type) was used.

TABLE 4

|  | Dye abbreviation | $\lambda_{max}$ [nm] | $\varepsilon_A$ [M$^{-1}$cm$^{-1}$] | $\varepsilon_B$ [M$^{-1}$cm$^{-1}$] | $\varepsilon_B/\varepsilon_A$ | $\lambda_{80}$ [nm] | $\lambda_{max} - \lambda_{80}$ [nm] |
|---|---|---|---|---|---|---|---|
| Dye for example | A1-1 | 691 | 0.0130 | 1 | 76.9 | 630 | 61 |
|  | A1-2 | 697 | 0.0066 | 1 | 152 | 634 | 63 |
|  | A1-3 | 698 | 0.0065 | 1 | 154 | 637 | 61 |
|  | A1-4 | 695 | 0.0104 | 1 | 96.2 | 633 | 62 |
|  | A1-5 | 693 | 0.0144 | 1 | 69.4 | 634 | 59 |
|  | A1-6 | 693 | 0.0139 | 1 | 71.9 | 633 | 60 |
|  | A1-7 | 693 | 0.0147 | 1 | 68.0 | 633 | 60 |
|  | A1-8 | 695 | 0.0117 | 1 | 85.5 | 634 | 61 |
|  | A1-9 | 703 | 0.0082 | 1 | 122 | 651 | 52 |
|  | A1-10 | 698 | 0.0118 | 1 | 84.7 | 646 | 52 |
|  | A1-11 | 700 | 0.0110 | 1 | 90.9 | 648 | 52 |
|  | A1-12 | 700 | 0.0116 | 1 | 86.2 | 648 | 52 |
|  | A1-13 | 698 | 0.0113 | 1 | 88.5 | 645 | 53 |
|  | A1-14 | 699 | 0.0121 | 1 | 82.6 | 647 | 52 |
|  | A1-15 | 698 | 0.0112 | 1 | 89.3 | 646 | 52 |
|  | A1-16 | 702 | 0.0111 | 1 | 90.1 | 650 | 52 |
|  | A1-17 | 705 | 0.0081 | 1 | 123 | 653 | 52 |
|  | A1-18 | 699 | 0.0110 | 1 | 90.9 | 649 | 50 |
|  | A1-19 | 699 | 0.0126 | 1 | 79.4 | 648 | 51 |
|  | A1-20 | 703 | 0.0100 | 1 | 100 | 651 | 52 |
|  | A1-21 | 705 | 0.0143 | 1 | 69.9 | 656 | 49 |
|  | A1-22 | 711 | 0.0122 | 1 | 82.0 | 660 | 51 |
|  | A1-23 | 713 | 0.0124 | 1 | 80.6 | 663 | 50 |
|  | A1-24 | 700 | 0.0110 | 1 | 89.7 | 651 | 49 |
|  | A1-25 | 704 | 0.0130 | 1 | 77.6 | 653 | 51 |
|  | A1-26 | 707 | 0.0140 | 1 | 71.6 | 654 | 53 |
| Dye for comparative example | A2 | 698 | 0.0225 | 1 | 44.4 | 637 | 61 |
|  | A3 | 706 | 0.0163 | 1 | 61.3 | 656 | 50 |
|  | A4 | 711 | 0.0294 | 1 | 34.0 | 660 | 51 |
|  | A5 | 684 | 0.0103 | 1 | 97.1 | 605 | 79 |
|  | A6 | 707 | 0.0212 | 1 | 47.2 | 633 | 74 |
|  | A7 | 633 | 0.0258 | 1 | 38.8 | 573 | 60 |
|  | A8 | 677 | 0.0091 | 1 | 110 | 611 | 66 |

As illustrated in Table 4, the dyes (A1-1) to (A1-26) each satisfy (i-1) to (i-3) described previously. On the other hand, the dyes (A2) to (A4) do not satisfy (i-2), and the dye (A6) satisfies neither (i-2) nor (i-3). Further, the dye (A7) satisfies neither (i-1) nor (i-2), and the dyes (A5) and (A8) do not satisfy (i-1) to (i-3) all.

(2) Solubility of Dye

Regarding several kinds of the dyes obtained above, solubility to a resin solution was evaluated. In a solubility test, as the resin solution, there was used a solution having a resin concentration of 12.5 mass % that was prepared by dissolving a polyester resin (product name: OKP850 made by Osaka Gas Chemicals Co., Ltd.) in a mixed solvent (cyclohexanone:methyl isobutyl ketone (MIBK)=1:1). Results are illustrated in Table 5 together with the kinds of the used dyes. Incidentally, the temperature of the resin solution in the solubility test was 50° C., the dye was put into the resin solution, the resultant resin solution was stirred for two hours, and whether or not the dye was dissolved was observed visually. Evaluation criteria of the solubility are as follows.

A: Solubility greater than 10 mass %
B: Solubility greater than 5 mass % and 10 mass % or less
C: Solubility 5 mass % or less

TABLE 5

| Dye abbreviation | Solubility [mass %] | Evaluation* |
| --- | --- | --- |
| A1-1 | 1 | C |
| A1-2 | 5 | C |
| A1-8 | 3 | C |
| A1-9 | 12 | A |
| A1-15 | 15 | A |
| A1-16 | 12 | A |
| A1-21 | 12 | A |

*A: greater than 10 mass % B: greater than 5 mass % and 10 mass % or less C: 5 mass % or less As illustrated in Table 5, the dyes (A1-9), (A1-15), (A1-16), and (A1-21) each having a branch structure in the substituent $R^1$ have a high solubility to the resin solution as compared to the other dyes not having the branch structure. Thereby, it is inferred that the branch structure of the substituent $R^1$ contributes to the improvement in the solubility. When the solubility to the resin solution is high, coatability improves and a resin film having a thin thickness can be formed. Further, by forming a thin resin film, resin expansion during a heat treatment can be suppressed.

Production of NIR Filter [I]

Example 1-1 to Example 1-14

The dyes illustrated in Table 5 were each mixed with a 15 mass % cyclohexanone solution having a polyester resin (OKP850), and the resultant solutions were each stirred and dissolved at room temperature, to thereby obtain coating liquids. Incidentally, in Example 1-14, the used dye (A9) was not dissolved in the resin solution, and thus a coating liquid was not able to be prepared. The obtained coating liquids were each applied on a glass (non-alkali glass; product name: AN100 made by Asahi Glass Co., Ltd.) substrate having a thickness of 0.3 mm by a spin coating method and heated and dried to form absorption layers having a thickness of 0.9 to 1.0 μm, and NIR filters (Example 1-1 to Example 1-13) were obtained.

Example 2-1 to Example 2-8

The dyes illustrated in Table 6 were each mixed with a 15 mass % cyclohexanone solution having a cyclic olefin resin (product name: ARTON (registered trademark) made by JSR Corporation) and the resultant solutions were each stirred and dissolved at room temperature, to thereby obtain coating liquids. Incidentally, in Example 2-8, the used dye (A9) was not dissolved in the resin solution, and thus a coating liquid was not able to be prepared. The obtained coating liquids were each applied on a glass (AN100) substrate having a thickness of 0.3 mm by a spin coating method and heated and dried to form absorption layers having a thickness of 0.9 to 1.0 μm, and NIR filters (Example 2-1 to Example 2-7) were obtained.

Example 3-1 to Example 3-10

The dyes illustrated in Table 7 were each mixed with a 15 mass % cyclohexanone solution having a polycarbonate resin (product name: Panlite (registered trademark) SP1516 made by Teijin Chemicals Ltd.) and the resultant solutions were each stirred and dissolved at room temperature, to thereby obtain coating liquids. Incidentally, in Example 3-10, the used dye (A9) was not dissolved in the resin solution, and thus a coating liquid was not able to be prepared. The obtained coating liquids were each applied on a glass (AN100) substrate having a thickness of 0.3 mm by a spin coating method and heated and dried to form absorption layers having a thickness of 0.9 μm, and NIR filters (Example 3-1 to Example 3-9) were obtained.

<Evaluation of NIR filter [I]>

(1) Spectral Characteristic

Regarding the fabricated NIR filters (Example 1-1 to Example 1-13, Example 2-1 to Example 2-7, and Example 3-1 to Example 3-9), each spectral transmittance curve was measured using an ultraviolet-visible spectrophotometer. From measurement results, of each of the absorption layers, a maximum absorption wavelength $\lambda_{Pmax}$, a minimum transmittance of light with a wavelength of 430 to 550 nm, an average transmittance of light with a wavelength of 430 to 480 nm, an absorption width with which the transmittance of light with a wavelength of 670 to 730 nm becomes 1% or less (difference between the longest wavelength $\lambda_b$ with which the transmittance becomes 1% or less and the shortest wavelength $\lambda_a$ with which the transmittance becomes 1% or less ($\lambda_b-\lambda_a$); described as an absorption width), a wavelength $\lambda_{P80}$ with which the transmittance becomes 80% on a shorter wavelength side than the maximum absorption wavelength with the transmittance at the maximum absorption wavelength $\lambda_{Pmax}$ set to 10%, and a difference between the maximum absorption wavelength $\lambda_{Pmax}$ and the wavelength $\lambda P_{80}$ ($\lambda_{Pmax}-\lambda_{P80}$) were calculated. Results are illustrated in Table 6 to Table 8 together with each film thickness of the absorption layers and each ratio (mass %) of the dye in the absorption layer to the resin. Incidentally, the values illustrated in Table 6 to Table 8 are values obtained by subtracting the transmittance of the glass substrate and the like from the spectral transmittance curves of the NIR filters. Specifically, values are made by subtracting absorption of the glass substrate and effects of reflections on the interface between the glass substrate and the absorption layer and the interface between the glass substrate and the air and calculating reflection on the interface between the absorption layer and the air.

TABLE 6

| | Dye abbreviation | Resin | Film thickness [μm] | Dye amount relative to 100 parts by mass of resin [part by mass] | $\lambda_{Pmax}$ [nm] | Minimum transmittance of 430 nm to 550 nm [%] | Absorption width [nm] | $\lambda_{P80}$ [nm] | $\lambda_{Pmax} - \lambda_{P80}$ [nm] | Average transmittance of 430 nm to 480 nm [%] |
|---|---|---|---|---|---|---|---|---|---|---|
| Ex. 1-1 | A1-6 | OKP850 | 1.0 | 10.7 | 704 | 84.7 | 30 | 601 | 103 | 91.6 |
| Ex. 1-2 | A1-7 | (Polyester | 1.0 | 11.6 | 704 | 84.7 | 30 | 601 | 103 | 91.3 |
| Ex. 1-3 | A1-9 | resin) | 0.9 | 10.3 | 714 | 87.1 | 30 | 614 | 100 | 94.5 |
| Ex. 1-4 | A1-11 | | 1.0 | 10.7 | 711 | 86.2 | 30 | 615 | 96 | 91.8 |
| Ex. 1-5 | A1-14 | | 1.0 | 10.9 | 709 | 85.8 | 30 | 613 | 96 | 91.7 |
| Ex. 1-6 | A1-15 | | 1.0 | 10.3 | 707 | 85.0 | 31 | 610 | 97 | 91.7 |
| Ex. 1-7 | A1-16 | | 1.0 | 11.3 | 711 | 84.1 | 31 | 614 | 97 | 92.6 |
| Ex. 1-8 | A1-19 | | 1.0 | 10.9 | 709 | 84.3 | 30 | 614 | 95 | 91.8 |
| Ex. 1-9 | A1-20 | | 1.0 | 10.4 | 713 | 86.5 | 30 | 612 | 101 | 94.0 |
| Ex. 1-10 | A1-21 | | 1.0 | 10.1 | 714 | 84.1 | 30 | 623 | 91 | 91.4 |
| Ex. 1-11 | A3 | | 1.0 | 8.5 | 717 | 81.9 | 31 | 624 | 93 | 89.9 |
| Ex. 1-12 | A5 | | 1.0 | 10.6 | 697 | 89.2 | 31 | 576 | 121 | 94.5 |
| Ex. 1-13 | A6 | | 1.0 | 15.1 | 719 | 73.8 | 30 | 610 | 109 | 83.5 |
| Ex. 1-14 | A9 | | — | 7.0 | — | — | — | — | — | — |

As illustrated in Table 6, among Examples using the polyester resin, Example 1-1 to Example 1-10 each had the maximum absorption wavelength $\lambda_{Pmax}$ of 704 to 714 nm, the minimum transmittance of the light with a wavelength of 430 to 550 nm of 84% or more, and $\lambda_{Pmax}-\lambda_{P80}$ of 103 nm or less. This indicates that the examples containing the dyes satisfying (i-1) to (i-3) all can maintain the transmittance of the wavelength of 600 to 700 nm to be high, and further the transmittance of the visible light with a wavelength of 430 to 550 nm is high and the absorption curve in the vicinity of a boundary between the visible region and the near-infrared region is steep.

In contrast to this, in Example 1-11 and Example 1-13 that do not satisfy at least one requirement of (i-1) to (i-3), the minimum transmittance of the light with a wavelength of 430 to 550 nm was 82% or less, and in Example 1-12, $\lambda_{Pmax}-\lambda_{P80}$ was 121 nm. In Example 1-11 and Example 1-13, the transmittance of the visible light with a wavelength of 430 to 550 nm is low, and in Example 1-12, the slope of the absorption curve in the vicinity of a boundary between the visible region and the near-infrared region is gentle.

As illustrated in Table 7, among Examples using the cyclic olefin resin, Example 2-1 to Example 2-4 each had the maximum absorption wavelength $\lambda_{Pmax}$ of the wavelength of 698 to 704 nm, the minimum transmittance of the light with a wavelength of 430 to 550 nm of 84% or more, and $\lambda_{Pmax}-\lambda_{P80}$ of 103 nm or less. This indicates that the examples containing the dyes satisfying (i-1) to (i-3) all can maintain the transmittance of the wavelength of 600 to 700 nm to be high, and further the transmittance of the visible light with a wavelength of 430 to 550 nm is high, and the absorption curve in the vicinity of a boundary between the visible region and the near-infrared region is steep. In contrast to this, in Example 2-5 to Example 2-7 that do not satisfy at least one requirement of (i-1) to (i-3), the minimum transmittance of the light with a wavelength of 430 to 550 nm is less than 84%, and the transmittance of the visible light with a wavelength of 430 to 550 nm is low. Further, the dye (A9) has a low solubility to the cyclic olefin resin, and the degree of freedom to the resin film thickness is small.

TABLE 7

| | Dye abbreviation | Resin | Film thickness [μm] | Dye amount relative to 100 parts by mass of resin [part by mass] | $\lambda_{Pmax}$ [nm] | Minimum transmittance of 430 nm to 550 nm [%] | Absorption width [nm] | $\lambda_{P80}$ [nm] | $\lambda_{Pmax} - \lambda_{P80}$ [nm] | Average transmittance of 430 nm to 480 nm [%] |
|---|---|---|---|---|---|---|---|---|---|---|
| Ex. 2-1 | A1-9 | ARTON | 0.9 | 11.6 | 704 | 91.9 | 30 | 601 | 103 | 97.0 |
| Ex. 2-2 | A1-15 | (Cyclic olefin | 1.0 | 12.7 | 698 | 84.6 | 30 | 599 | 99 | 92.9 |
| Ex. 2-3 | A1-16 | resin) | 0.9 | 14.8 | 701 | 85.8 | 30 | 602 | 99 | 93.2 |
| Ex. 2-4 | A1-21 | | 0.9 | 11.8 | 704 | 84.6 | 30 | 615 | 89 | 92.1 |
| Ex. 2-5 | A2 | | 1.7 | 4.4 | 706 | 82.8 | 30 | 608 | 98 | 91.2 |
| Ex. 2-6 | A3 | | 1.7 | 5.5 | 714 | 83.7 | 30 | 622 | 92 | 91.8 |
| Ex. 2-7 | A4 | | 1.7 | 5.7 | 712 | 75.2 | 30 | 622 | 90 | 84.4 |
| Ex. 2-8 | A9 | | — | 7.0 | — | — | — | — | — | — |

TABLE 8

| | Dye abbreviation | Resin | Film thickness [μm] | Dye amount relative to 100 parts by mass of resin [part by mass] | $\lambda_{Pmax}$ [nm] | Minimum transmittance of 430 nm to 550 nm [%] | Absorption width [nm] | $\lambda_{P80}$ [nm] | $\lambda_{Pmax} - \lambda_{P80}$ [nm] | Average transmittance of 430 nm to 480 nm [%] |
|---|---|---|---|---|---|---|---|---|---|---|
| Ex. 3-1 | A1-6 | SP1516 (Polycarbonate resin) | 0.9 | 14.5 | 702 | 85.3 | 30 | 598 | 104 | 92.8 |
| Ex. 3-2 | A1-9 | | 0.9 | 12.6 | 700 | 84.5 | 30 | 597 | 103 | 91.4 |
| Ex. 3-3 | A1-15 | | 0.9 | 10.2 | 711 | 89.8 | 30 | 612 | 99 | 96.5 |
| Ex. 3-4 | A1-16 | | 0.9 | 11.7 | 704 | 86.0 | 31 | 609 | 95 | 93.0 |
| Ex. 3-5 | A1-19 | | 0.9 | 13.1 | 700 | 84.5 | 30 | 596 | 104 | 90.8 |
| Ex. 3-6 | A1-21 | | 0.9 | 12.1 | 710 | 89.8 | 30 | 611 | 99 | 95.1 |
| Ex. 3-7 | A2 | | 0.9 | 8.6 | 713 | 83.1 | 31 | 614 | 99 | 91.2 |
| Ex. 3-8 | A3 | | 0.9 | 9.1 | 714 | 83.7 | 30 | 623 | 91 | 91.2 |
| Ex. 3-9 | A4 | | 0.9 | 12.2 | 718 | 75.9 | 30 | 624 | 94 | 84.0 |
| Ex. 3-10 | A9 | | — | 7.0 | — | — | — | — | — | — |

As illustrated in Table 8, among Examples using the polycarbonate resin, Example 3-1 to Example 3-6 each had the maximum absorption wavelength $\lambda_{Pmax}$ of the wavelength of 700 to 711 nm, the minimum transmittance of the light with a wavelength of 430 to 550 nm of 84% or more, and $\lambda_{Pmax}-\lambda_{P80}$ of 104 nm or less. This indicates that the examples containing the dyes satisfying (i-1) to (i-3) all can maintain the transmittance of the light with a wavelength of 600 to 700 nm to be high, and further the transmittance of the visible light with a wavelength of 430 to 550 nm is high and the absorption curve in the vicinity of a boundary between the visible region and the near-infrared region is steep. In contrast to this, in Example 3-7 to Example 3-10 that do not satisfy at least one requirement of (i-1) to (i-3), the minimum transmittance of the light with a wavelength of 430 to 550 nm is less than 84%, and the transmittance of the visible light with a wavelength of 430 to 550 nm is low. Further, the dye (A9) has a low solubility to the polycarbonate resin, and the degree of freedom to the resin film thickness is small.

Production of NIR Filter [II]

Example 4-1

Figure 2:
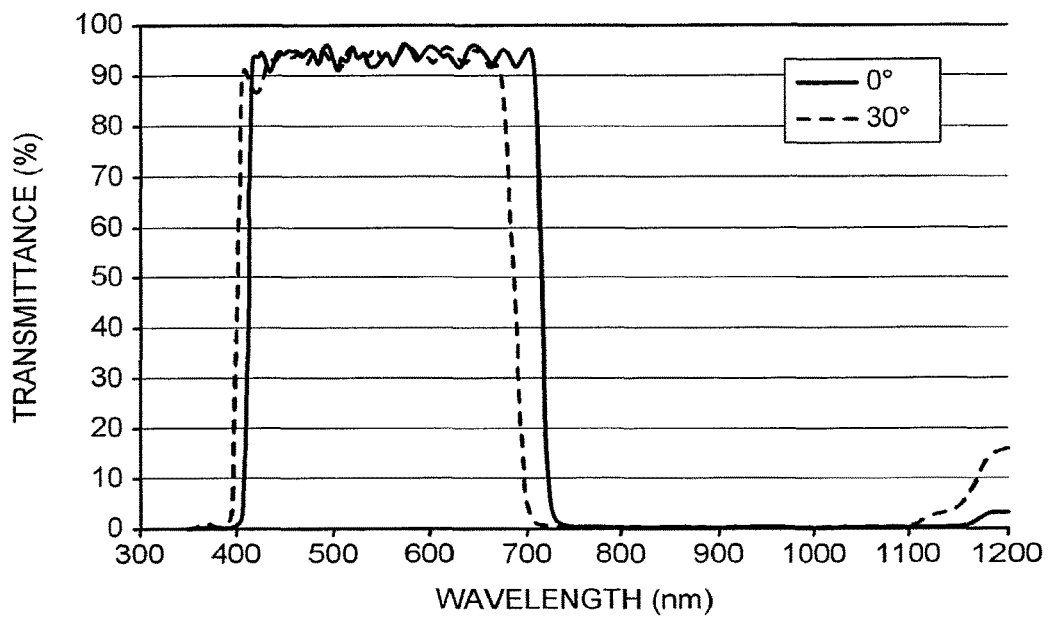
FIG. 2 is a view illustrating spectral transmittance curves of a reflection layer used in an optical filter of Example.

On a non-alkali glass (AN100) substrate having a thickness of 0.3 mm, a $TiO_2$ layer and a $SiO_2$ layer were stacked alternately by a vapor deposition method, thereby forming a reflection layer constituted of a dielectric multilayer film having 52 layers. The reflection layer was obtained by performing a simulation with the number of stacking layers of the dielectric multilayer films, a film thickness of the $TiO_2$ layer, and a film thickness of the $SiO_2$ layer being parameters, so that (iii-1) and (iii-2) are satisfied, specifically, the transmittance of light with a wavelength of 420 to 695 nm becomes 90% or more, and the transmittance of light with a wavelength of 704 nm (maximum wavelength with which the transmittance of light with a wavelength of 650 to 800 nm of the absorption layer becomes 1%) to 1100 nm becomes 1% or less in respective spectral transmittance curves at incident angles of 0° and 30°. FIG. 2 illustrates spectral transmittance curves (incident angles of 0° and 30°) of a reflection layer produced based on the above design.

Further, to a 15 mass % cyclohexanone solution having a polyester resin (OKP850), 1-[3-(trimethoxysilyl)propyl]urea as a silane coupling agent was added and dissolved by a ratio to be 3 mass % relative to the mass of the polyester resin. Moreover, to this resin solution, the NIR absorbing dye (A1-6) obtained above and the UV dye (M-2) were added and dissolved by a ratio to be 12 mass % and a ratio to be 4.5 mass % relative to the mass of the polyester resin respectively, thereby preparing a coating liquid for forming an absorption layer.

This coating liquid was applied by a spin coating method on a surface opposite to a reflection layer formation surface of the above-described glass substrate on which the reflection layer was formed, and then heated under atmospheric pressure for five minutes at 90° C. and then for one hour at 150° C., thereby forming an absorption layer having a thickness of 1 μm. Thereafter, a $TiO_2$ layer and a $SiO_2$ layer were stacked alternately on the surface of the absorption layer to form an anti-reflection layer constituted of a dielectric multilayer film, thereby obtaining an optical filter. Note that the constitution of the anti-reflection layer was also determined by performing a simulation with the number of stacking layers of the dielectric multilayer film, a film thickness of the $TiO_2$ layer, and a film thickness of the $SiO_2$ layer being parameters so as to have a predetermined optical characteristic.

Example 4-2 to Example 4-11

Optical filters were produced similarly to Example 4-1 except that at least one of the kind and thickness of the substrate, the kind and addition amount of the dye to be added to the coating liquid for forming the absorption layer, the kind of resin, and the thickness of the absorption layer is changed as described in Table 9 and further the constitution of the reflection layer is also changed so as to have a constitution satisfying (iii-1) and (iii-2) in each of Examples. The near-infrared absorbing glass substrate used in Examples 4-8 to 4-10 is a substrate made of CuO containing fluorophosphate glass (product name: NF-50TX, made by Asahi Glass Co., Ltd.)

<Evaluation of NIR filter [II]>

(1) Optical Characteristic

Figure 3:
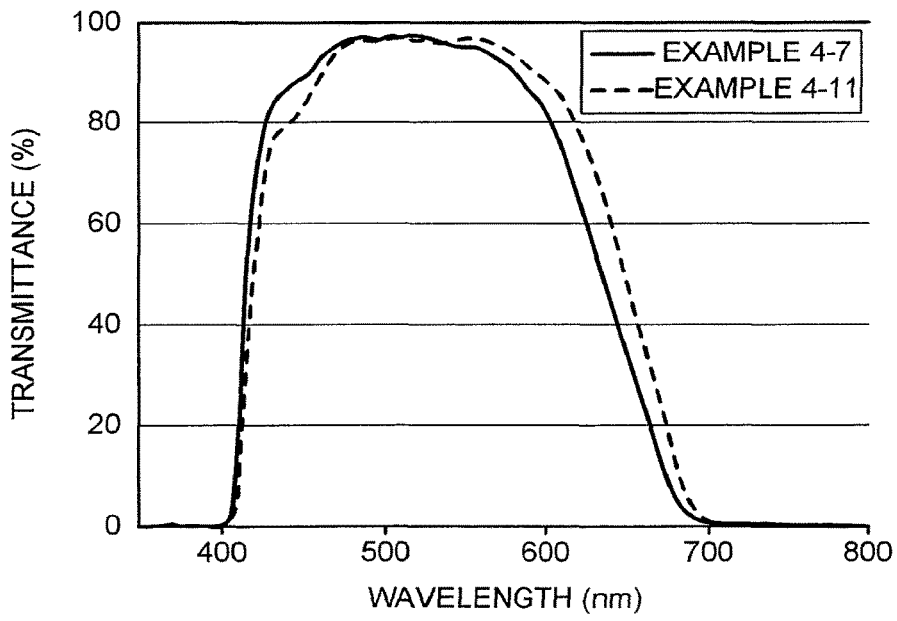
FIG. 3 is a view illustrating spectral transmittance curves obtained by measuring optical filters of Examples.

Regarding the fabricated optical filters (Example 4-1 to Example 4-11), spectral transmittance curves (incident angles of 0° and 30°) were measured using an ultraviolet-visible spectrophotometer, and from measurement results thereof, each optical characteristic was calculated. Results are illustrated in Table 9 collectively. Further, spectral transmittance curves of Example 4-7 and Example 4-11 are illustrated in FIG. 3. Incidentally, in Table 9, the values of the average transmittance and the minimum transmittance are values calculated from the spectral transmittance curve at an incident angle of 0°.

TABLE 9

| | | Ex. 4-1 | Ex. 4-2 | Ex. 4-3 | Ex. 4-4 | Ex. 4-5 | Ex. 4-6 | Ex. 4-7 | Ex. 4-8 | Ex. 4-9 | Ex. 4-10 | Ex. 4-11 |
|---|---|---|---|---|---|---|---|---|---|---|---|---|
| Substrate | Material | | | | Non-alkali glass | | | | | Near-infrared absorbing glass | | Non-alkali glass |
| | Thickness [mm] | | | | 0.3 | | | | | 0.2 | | 0.3 |
| Near-infrared absorbing dye A | Dye kind | A1-6 | A1-7 | A1-9 | A1-15 | A1-16 | A1-7 | | A1-15 | | | A3 |
| | Dye amount relative to 100 parts by mass of resin [part by mass] | | | | 12.0 | | | 10.4 | 5.5 | | 6.0 | 12.0 |
| Ultraviolet absorbing dye U | Dye kind | | | | | M-2 | | | | | M-6 | M-2 |
| | Dye amount relative to 100 parts by mass of resin [part by mass] | | | | | 4.5 | | | | | 6.0 | 4.5 |
| Transparent resin | Resin kind | | | OKP850 | | | Neopulim C3450 | | Neopulim C3G30 | JL-20 | Neopulim C3G30 | OKP850 |
| Absorption layer | Film thickness [µm] | | | 1.0 | | | 0.9 | | | | 1.0 | |
| Optical characteristic | Average transmittance [%] (350-395 nm) | 0.17 | 0.17 | 0.18 | 0.18 | 0.17 | 0.05 | 0.05 | 0.34 | 0.35 | 0.95 | 0.05 |
| | Average transmittance [%] (430-550 nm) | 92.1 | 92.4 | 92.8 | 93.1 | 93.1 | 93.2 | 94.3 | 93.0 | 93.2 | 92.8 | 92.5 |
| | Average transmittance [%] (430-480 nm) | 87.2 | 87.6 | 89.2 | 88.6 | 88.8 | 89.7 | 90.9 | 90.7 | 90.7 | 90.4 | 86.7 |
| | Average transmittance [%] (600-700 nm) | 30.1 | 31.0 | 34.7 | 35.3 | 38.2 | 28.5 | 36.5 | 30.9 | 31.6 | 29.5 | 46.9 |
| | Average transmittance [%] (710-1100 nm) | 0.06 | 0.05 | 0.03 | 0.07 | 0.03 | 0.15 | 0.11 | −0.15 | −0.06 | −0.04 | 0.06 |
| | Transmittance average shift amount [%/nm] (385-430 nm) | 5.09 | 4.45 | 4.73 | 4.76 | 4.12 | 5.68 | 5.55 | 3.95 | 4.02 | 4.02 | 4.37 |
| | Transmittance average shift amount [%/nm] (600-700 nm) | 1.53 | 1.24 | 1.43 | 1.37 | 1.40 | 1.53 | 1.62 | 2.00 | 2.02 | 2.02 | 1.54 |
| | Minimum transmittance [%] (430-550 nm) | 75.7 | 75.9 | 78.3 | 77.6 | 77.4 | 81.5 | 82.8 | 85.5 | 84.6 | 83.8 | 74.8 |
| Heat resistance | Transmittance variation amount [%] (400-800 nm) | 5.38 | — | — | 1.21 | — | 0.47 | 0.62 | — | — | — | — |
| | Judgment** | C | — | — | B | — | A | A | — | — | — | — |
| Light resistance | Transmittance variation amount [%] (400-800 nm) | 0.90 | 0.95 | — | 0.26 | 1.03 | — | — | — | — | — | — |
| | Judgment*** | B | B | — | A | B | — | — | — | — | — | — |

**A: less than 1.0%, B: not less than 1.0% nor more than 5.0 mass %, C: greater than 5.0%
***A: less than 0.5%, B: not less than 0.5% nor more than 2.0%, C: greater than 2.0%

As is clear from Table 9, the optical filters of Example 4-1 to Example 4-10 each satisfied (iv-1) to (iv-6). That is, the above optical filters each were an optical filter having high use efficiency of visible light and having low incident angle dependence in a long wavelength region of the visible region. On the other hand, the optical filter of Example 4-11 was insufficient in terms of the transmittance in a wavelength region of 430 to 550 nm because the minimum transmittance of the light with the wavelength of 430 to 550 nm was less than 75%. Further, the optical filter of Example 4-11 was insufficient in terms of the transmittance of a wavelength of 430 to 480 nm because the average transmittance of the light with the wavelength of 430 to 480 nm was less than 87%.

(2) Heat Resistance

A heat resistance test was performed on the fabricated optical filters (Example 4-1, Example 4-4, Example 4-6, and Example 4-7) to evaluate heat resistance. In the heat resistance test, the optical filter was heated for five hours at 180° C. Before and after heating, a spectral transmittance curve (incident angle of 0°) was measured using an ultraviolet-visible spectrophotometer, the maximum transmittance of light with a wavelength of 400 to 800 nm before and after heating was obtained, and a variation amount thereof was calculated by the following expression.

Maximum transmittance variation amount=(maximum transmittance of light with a wavelength of 400 to 800 nm before heating)−(maximum transmittance of light with a wavelength of 400 to 800 nm after heating) Results are illustrated together in Table 9.

Evaluation criteria of the heat resistance are as follows.
A: Maximum transmittance variation amount less than 1.0%
B: Maximum transmittance variation amount not less than 1.0% nor more than 5.0%
C: Maximum transmittance variation amount greater than 5.0%

As is clear from Table 9, it was revealed that the optical filters of Example 4-6 and Example 4-7 are each particularly excellent in heat resistance.

(3) Light Resistance

A light resistance test was performed on the fabricated optical filters (Example 4-1, Example 4-2, Example 4-4, and Example 4-5) to evaluate light resistance. In the light resistance test, a xenon lamp was used to irradiate these optical filters for 80 hours in total by adjusting the illuminance in a wavelength of 300 to 400 nm to 75 W/m$^2$. Before and after irradiation, a spectral transmittance curve (incident angle of 0°) was measured using an ultraviolet-visible spectrophotometer, the maximum transmittance of light with a wavelength of 400 to 800 nm before and after irradiation was obtained, and a variation amount thereof was calculated by the following expression.

Maximum transmittance variation amount=(maximum transmittance of light with a wavelength of 400 to 800 nm before irradiation)−(maximum transmittance of light with a wavelength of 400 to 800 nm after irradiation) Results are illustrated together in Table 9.

Evaluation criteria of the light resistance are as follows.
A: Maximum transmittance variation amount less than 0.5%
B: Maximum transmittance variation amount not less than 0.5% nor more than 2.0%
C: Maximum transmittance variation amount greater than 2.0%

As is clear from Table 9, it was revealed that the optical filter of Example 4-4 using the dye (A1-15) having the substituent $R^1$ being an alkyl group in formula (Ai) is particularly excellent in light resistance.

The optical filter of the present invention has a good near-infrared blocking characteristic and is excellent in transmitting property of visible light, and thus it is useful for an imaging device such as a digital still camera.

What is claimed is:

1. An optical filter, comprising:
   an absorption layer containing a near-infrared absorbing dye with an absorption characteristic which is measured by dissolving the near-infrared absorbing dye in dichloromethane and satisfies (i-1) to (i-3):
   (i-1) a maximum absorption wavelength $\lambda_{max}$ occurs in a range of 670 to 730 nm in an absorption spectrum of a wavelength of 400 to 800 nm,
   (i-2) a maximum absorption coefficient $\varepsilon_A$ of light with a wavelength of 430 to 550 nm and a maximum absorption coefficient $\varepsilon_B$ of light with a wavelength of 670 to 730 nm satisfy the following expression:

$\varepsilon_B/\varepsilon_A \geq 65$, and (i-3) in a spectral transmittance curve, the maximum absorption wavelength $\lambda_{max}$ and a wavelength $\lambda_{80}$ satisfy $(\lambda_{max}-\lambda_{80}) \leq 65$, where $\lambda_{80}$ is an absorption wavelength with which the transmittance becomes 80% on a shorter wavelength side than the maximum absorption wavelength with the transmittance at the maximum absorption wavelength $\lambda_{max}$ set to 10%,
   wherein
   the near-infrared absorbing dye is a squarylium-based dye represented by formula (AI) or formula (AII):

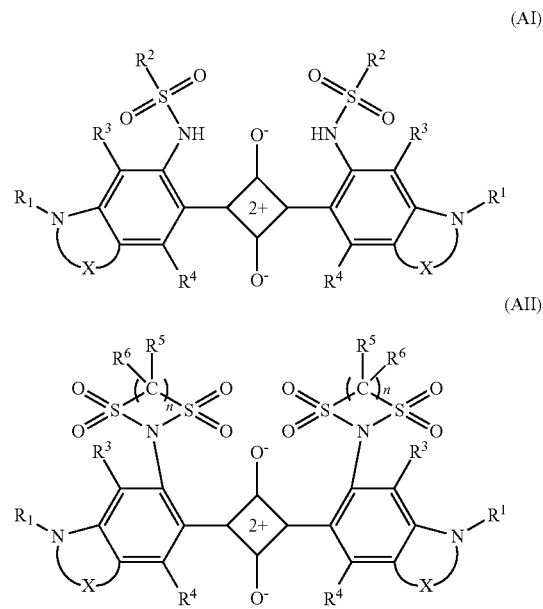

where
   X is independently a bivalent organic group represented by formula (1) or formula (2), in which one or more hydrogen atoms are optionally substituted with a halogen atom or an alkyl group or alkoxy group having 1 to 12 carbon atoms:

—(CH$_2$)$_{n1}$—  (1)

in the formula (1), n1 is 2 or 3;

—(CH$_2$)$_{n2}$—O—(CH$_2$)$_{n3}$—  (2)

in the formula (2), n2 and n3 are independently an integer of 0 to 2, and n2+n3 is 1 or 2;
   $R^1$ independently represents a saturated or unsaturated hydrocarbon group having 1 to 12 carbon atoms which optionally have a branch and optionally contain a saturated ring structure, a saturated cyclic hydrocarbon group having 3 to 12 carbon atoms, an aryl group having 6 to 12 carbon atoms, or an alaryl group having 7 to 13 carbon atoms;
   $R^2$ independently represents a hydrocarbon group having 1 to 25 carbon atoms in which one or more hydrogen atoms are optionally substituted with a halogen atom, a hydroxy group, a carboxy group, a sulfo group, or a cyano group and which optionally contain an unsaturated bond, an oxygen atom, or a saturated or unsaturated ring structure between carbon atoms;
   $R^3$, $R^4$, $R^5$, and $R^6$ independently represent a hydrogen atom, a halogen atom, or an alkyl group or alkoxy group having 1 to 10 carbon atoms; and
   n is 2 or 3.

2. The optical filter according to claim 1, wherein
the absorption layer is provided on a transparent substrate.

3. The optical filter according to claim 2, wherein
the transparent substrate comprises a glass.

4. The optical filter according to claim 3, wherein
the glass is a near-infrared absorbing glass.

5. The optical filter according to claim 2, wherein
the transparent substrate comprises a resin.

6. The optical filter according to claim 1, wherein
X in the formula (AI) and the formula (AII) is a bivalent organic group represented by formula (3):

where the formula (3) represents a bivalent group in which the left side is bonded to a benzene ring and the right side is bonded to N, n4 is 1 or 2, $R^7$ is independently an alkyl group or alkoxy group having 1 to 12 carbon atoms which optionally have a branch, and $R^8$ is independently a hydrogen atom or an alkyl group or alkoxy group having 1 to 12 carbon atoms which optionally have a branch.

7. The optical filter according to claim 6, wherein
in the formula (3), $R^7$ is independently an alkyl group or alkoxy group having 1 to 6 carbon atoms which optionally have a branch, and $R^8$ is independently a hydrogen atom or an alkyl group or alkoxy group having 1 to 6 carbon atoms which optionally have a branch.

8. The optical filter according to claim 1, wherein the absorption layer further contains an ultraviolet absorbing dye satisfying (ii-11:

(ii-1) a maximum absorption wavelength occurs in a range of 360 to 415 nm in an absorption spectrum of a wavelength of 350 to 800 nm measured by dissolving the ultraviolet absorbing dye in dichloromethane.

9. The optical filter according to claim 8, wherein
the ultraviolet absorbing dye is a compound represented by formula (M):

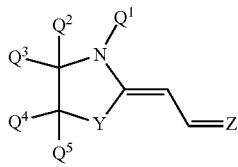

where Y represents an oxygen atom or a methylene group substituted with $Q^6$ and $Q^7$ which independently represent a hydrogen atom, a halogen atom, or an alkyl group or alkoxy group having 1 to 10 carbon atoms;

$Q^1$ represents a monovalent hydrocarbon group having 1 to 12 carbon atoms which optionally have a substituent;

$Q^2$, $Q^3$, $Q^4$ and $Q^5$ each independently represent a hydrogen atom, a halogen atom, or an alkyl group or alkoxy group having 1 to 10 carbon atoms; and Z represents a bivalent group represented by one of formula (Z1) to formula (Z5):

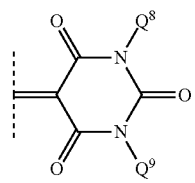

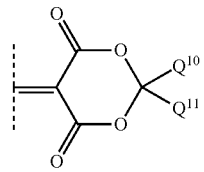

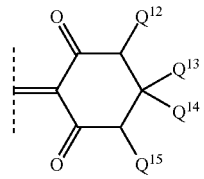

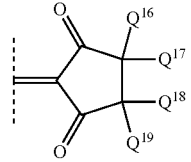

where $Q^8$ and $Q^9$ are both independently a monovalent hydrocarbon group having 1 to 12 carbon atoms which optionally have a substituent, and $Q^{10}$ to $Q^{19}$ are each independently a hydrogen atom or a monovalent hydrocarbon group having 1 to 12 carbon atoms which optionally have a substituent.

10. The optical filter according to claim 8, wherein
the absorption layer comprises a near-infrared absorbing layer containing the near-infrared absorbing dye and an ultraviolet absorbing layer containing the ultraviolet absorbing dye.

11. The optical filter according to claim 1 having a spectral characteristic satisfying (iv-1):

(iv-1) an average transmittance of light with a wavelength of 430 to 550 nm is 90% or more and a minimum transmittance of light with a wavelength of 430 to 550 nm is 75% or more in a spectral transmittance curve at an incident angle of 0°.

12. The optical filter according to claim 11, wherein
the spectral characteristic further satisfies one of (iv-2) to (iv-6):

(iv-2) an average transmittance of light with a wavelength of 600 to 700 nm is 25% or more in a spectral transmittance curve at an incident angle of 0°, (iv-3) an average transmittance of light with a wavelength of 350 to 395 nm is 2% or less in a spectral transmittance curve at an incident angle of 0°, (iv-4) an average transmittance of light with a wavelength of 710 to 1100 nm is 2% or less in a spectral transmittance curve at an incident angle of 0°, (iv-5) an average value of an absolute value of a difference between a transmittance of light with a wavelength of 385 to 430 nm in a spectral transmittance curve at an incident angle of 0° and a transmittance of light with a wavelength of 385 to 430 nm in a spectral transmittance curve at an incident angle of 30° is 7%/nm or less, and (iv-6) an average value of an absolute value of a difference between a transmittance of light with a wavelength of 600 to 700 nm in a spectral transmittance curve at an incident angle of 0° and a transmittance of light with a wavelength of 600 to 700 nm in a spectral transmittance curve at an incident angle of 30° is 7%/nm or less.

13. The optical filter according to claim 1, wherein in the formula (AI) and the formula (AII), X is one of bivalent organic groups represented by formula (11-1) to formula (12-3):

—C(CH$_3$)$_2$—CH(CH$_3$)— (11-1)

—C(CH$_3$)$_2$—CH$_2$— (11-2)

—C(CH$_3$)$_2$—CH(C$_2$H$_5$)— (11-3)

—C(CH$_3$)$_2$—C(CH$_3$)$_2$— (11-4)

—C(CH$_3$)$_2$—C(CH$_3$)(C$_2$H$_5$)— (11-5)

—C(CH$_3$)$_2$—C(CH$_3$)(CH(CH$_3$)$_2$)— (11-6)

—C(CH$_3$)$_2$—CH$_2$—CH$_2$— (12-1)

—C(CH$_3$)$_2$—CH$_2$—CH(CH$_3$)— (12-2)

—C(CH$_3$)$_2$—CH(CH$_3$)—CH$_2$— (12-3)

where groups represented by the formula (11-i) to the formula (12-3) are bonded to a benzene ring at the left side and are bonded to N at the right side respectively.

14. The optical filter according to claim 1, wherein in the formula (AI) and the formula (AII), R$^1$ is independently a group represented by formula (4-1) or formula (4-2):

(4-1)

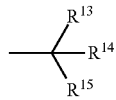
(4-2)

where R$^{11}$, R$^{12}$, R$^{13}$, R$^{14}$, and R$^{15}$ independently represent a hydrogen atom, a halogen atom, or an alkyl group having 1 to 4 carbon atoms.

15. The optical filter according to claim 1, wherein in the formula (AI), R$^2$ is independently an alkyl group or alkoxy group having 1 to 12 carbon atoms which optionally have a branch, or a hydrocarbon group having 6 to 16 carbon atoms which contains an unsaturated ring structure.

16. The optical filter according to claim 1, wherein the near-infrared absorbing dye is dissolved or dispersed in a transparent resin comprising at least one selected from the group consisting of an acrylic resin, an epoxy resin, an ene-thiol resin, a polycarbonate resin, a polyether resin, a polyarylate resin, a polysulfone resin, a polyethersulfone resin, a polyparaphenylene resin, a polyarylene ether phosphine oxide resin, a polyimide resin, a polyamide-imide resin, a polyolefin resin, a cyclic olefin resin, and a polyester resin.

17. The optical filter according to claim 1, further comprising:
a selected wavelength blocking layer satisfying (iii-1) and (iii-2) provided on at least one main surface of the absorption layer:
(iii-1) a transmittance of light with a wavelength of 420 to 695 nm is 90% or more in each spectral transmittance curves at incident angles of 0° and 30°, and
(iii-2) a transmittance of light with a wavelength of $\lambda_b$ nm to 1100 nm is 1% or less in each spectral transmittance curves at incident angles of 0° and 30°, where $\lambda_b$ is the maximum wavelength with which a transmittance of light with a wavelength of 650 to 800 nm of the absorption layer becomes 1%.

18. The optical filter according to claim 1, wherein an average transmittance of light with a wavelength of 430 to 480 nm is 87% or more in a spectral transmittance curve at an incident angle of 0°.

19. The optical filter according to claim 1, wherein the absorbing layer functions as a resin substrate.

20. An imaging device, comprising
a solid-state image sensing device,
an imaging lens, and
the optical filter according to claim 1.

* * * * *